(12) United States Patent
Abe

(10) Patent No.: US 7,928,414 B2
(45) Date of Patent: Apr. 19, 2011

(54) CHARGED PARTICLE BEAM WRITING APPARATUS AND CHARGED PARTICLE BEAM WRITING METHOD

(75) Inventor: Takayuki Abe, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 412 days.

(21) Appl. No.: 12/042,865

(22) Filed: Mar. 5, 2008

(65) Prior Publication Data
US 2008/0217554 A1 Sep. 11, 2008

(30) Foreign Application Priority Data
Mar. 9, 2007 (JP) .................................. 2007-060826

(51) Int. Cl.
*H01J 37/304* (2006.01)
(52) U.S. Cl. ............... 250/492.23; 250/398; 250/492.22
(58) Field of Classification Search ............... 250/492.23
See application file for complete search history.

(56) References Cited

U.S. PATENT DOCUMENTS

| | | | | |
|---|---|---|---|---|
| 4,943,730 A * | 7/1990 | Takemura et al. | .......... | 250/492.3 |
| 5,334,282 A * | 8/1994 | Nakayama et al. | ........... | 430/296 |
| 6,040,114 A * | 3/2000 | Inoue et al. | .................... | 430/296 |
| 7,099,733 B2 * | 8/2006 | Naya et al. | .................... | 700/121 |
| 7,417,715 B2 * | 8/2008 | Loopstra | .......................... | 355/75 |

FOREIGN PATENT DOCUMENTS

JP      2006-145746      6/2006

* cited by examiner

*Primary Examiner* — Phillip A Johnston
(74) *Attorney, Agent, or Firm* — Oblon, Spivak, McClelland, Maier & Neustadt, L.L.P.

(57) ABSTRACT

A charged particle beam writing apparatus includes an irradiation part configured to irradiate a charged particle beam; a first shaping aperture member having passing areas, that the charged particle beam passes through, on both sides of an area blocking the charged particle beam; a deflection part configured to deflect the charged particle beam that has passed through the first shaping aperture member; a second shaping aperture member having passing areas, that the charged particle beam passes through, on both sides of an area blocking the deflected charged particle beam; and a stage on which a target workpiece irradiated with the charged particle beam that has passed through the second shaping aperture member is placed.

13 Claims, 20 Drawing Sheets

Related Art

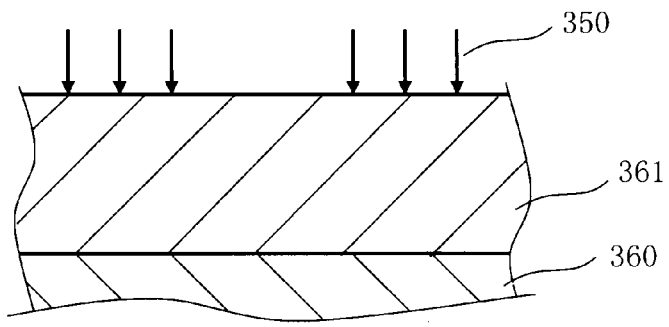
Related Art
FIG. 17A
Related Art
FIG. 17B
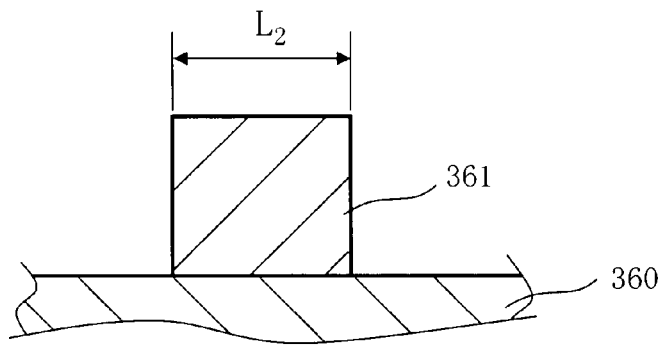
Related Art
FIG. 18A
Related Art
FIG. 18B

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from prior Japanese Patent Application No. 2007-060826 filed on Mar. 9, 2007 in Japan, the entire contents of which are incorporated herein by reference.

BACKGROUND OF THE INVENTION

1. Field of the Invention

The invention relates to a charged particle beam writing apparatus and a charged particle beam writing method, and in particular, relates to an electron beam writing apparatus featuring two aperture shapes and an electron beam writing method of writing using the device.

2. Related Art

Lithography technology assuming the role of advancement for still finer semiconductor devices is, among semiconductor manufacturing processes, an extremely important process to solely generate patterns. In recent years, with ever higher integration of LSI, the circuit line width demanded for semiconductor devices is becoming finer year by year. To form circuit patterns desired on such semiconductor devices, high-precision master patterns (also called reticles or masks) are needed. Here, electron beam writing technology has substantially excellent resolution and is used for the manufacture of high-precision subject copy patterns.

FIG. 12 is a conceptual diagram for illustrating an operation of a variable shaped electron beam writing apparatus.

The variable shaped electron beam (EB) writing apparatus operates as described below: First, a first shaping aperture plate 410 has an oblong, for example, a rectangular opening 411 for forming an electron beam 330 formed therein. Also a second shaping aperture plate 420 has a variable shaped opening 421 for forming the electron beam 330 after being passed through the opening 411 into a desired oblong shape formed therein. The electron beam 330 irradiated from a charged particle source 430 and passed through the opening 411 is deflected by a deflector. Then, the electron beam 330 passes through a portion of the variable shaped opening 421 before a target workpiece 340 mounted on a stage moving continuously in a predetermined direction (for example, the X direction) being irradiated with the electron beam 330. That is, an oblong shape that can pass through both the opening 411 and the variable shaped opening 421 is written in a writing area of the target workpiece 340. A method of creating an arbitrary shape by causing an electron beam to pass through both the opening 411 and the variable shaped opening 421 is called a variable shaped method.

FIG. 13 is a diagram exemplifying a shaped beam.

This is a pattern in which an image 333 passing through the variable shaped opening 421 of a passing image 331 that has passed through the first shaping aperture plate 410 is formed.

In a variable shaped electron beam writing apparatus, as described above, the beam size is adjusted by controlling the position of projection onto the variable shaped opening 421 of the second shaping aperture plate 420 by causing the passing image 331 of the first shaping aperture plate 410 to deflect by a deflector.

FIG. 14 exemplifies a pattern formed by one shot.

FIG. 15A and FIG. 15B are sectional views of process for pattern formation in which a positive type resist is used and a portion where a resist is removed is made a pattern.

As shown in FIG. 15A, a pattern 334 formed by using first and second shaping aperture plates and having a dimension $L_1$ as shown in FIG. 14 is written (exposed) by an electron beam 350 on a positive type resist 361 formed on a substrate 360 such as a mask blank. Then, an exposed portion is removed by development. A resist pattern of the pattern dimension $L_1$ as shown in FIG. 15B can thereby be formed. If a pattern is formed by one shot, as described above, only an error of shaping deflection will affect a dimension error of a pattern. Here, if a value of $L_1$ deviating from the average value $<L_1>$ is denoted by $\delta L_1$, a forming error of the pattern dimension $L_1$ can be shown by: forming error=$\pm \delta L_1$. However, when patterns leaving a resist are formed, left and right patterns are written by a writing apparatus and thus, position errors of two shots on both sides will further be added as an error factor.

FIG. 16 exemplifies a pattern formed by two shots.

FIG. 17A and FIG. 17B are sectional views of process for pattern formation in which a positive type resist is used and a portion where a resist is left is made a pattern.

As shown in FIG. 17A, two patterns 335 and 336 formed by using the first and second shaping aperture plates and having the dimension $L_1$ as shown in FIG. 16 are written (exposed) by the electron beam 350 on the positive type resist 361 formed on the substrate 360 such as a mask blank with spacing of $L_2$. Then, an exposed portion is removed by development. Resist patterns of the pattern dimension $L_2$ as shown in FIG. 17B can thereby be formed. Here, if the lower left of each written pattern is defined as a coordinate position, the position of the pattern 335 can be denoted as $(x_1, y_1)$ and that of the pattern 336 as $(x_2, y_2)$. Here, the dimension of $L_2$ of the resist pattern can be expressed as $L_2 = x_2 - x_1 - l_1$. If a deviation value $\delta x_1$ of $x_1$ from the average value $<x_1>$ is probabilistically calculated, $x_1$ can be expressed as $x_1 = <x_1> + \delta x_1$. Here and below, $<Q>$ denotes an average value of Q. Similarly, if a deviation value $\delta x_2$ of $x_2$ from the average value $<x_2>$ is probabilistically calculated, $x_2$ can be expressed as $x_2 = <x_2> + \delta x_2$. Similarly, if a deviation value $\delta l_1$ of $l_1$ from the average value $<l_1>$ is probabilistically calculated, $l_1$ can be expressed as $l_1 = <l_1> + \delta l_1$. Then, if a deviation value of $L_2$ from the average value $<L_2>$ is denoted as $\delta L_2$, the relation $<\delta L_2^2> = <L_2^2> - <L_2>^2 = <\delta x_1^2 + \delta x_2^2 + \delta l_1^2>$ can be shown to hold. Thus, an error of the pattern dimension $L_2$ can be expressed by: error=$\sqrt{(<\delta x_1^2> + <\delta x_2^2> + <\delta l_1^2>)}$. When the positive type resist 361 is used and a pattern is formed by leaving a resist, as described above, there has been a problem that, in addition to a forming error component $\sqrt{(\delta l_1^2)}$, further a position error component $\sqrt{(<\delta x_1^2> + <\delta x_2^2>)}$ is included, leading to a large error. The error of the dimension $L_2$ of a left pattern, as described above, is worse than that of the dimension $L_1$ of the aforementioned removed pattern and in some cases several times larger.

Thus, if high precision of dimensions of resist patterns is needed in a mask manufacturing process or a wafer process in which a writing apparatus directly writing to a wafer is used, steps described below have been taken. For example, if dimensions are determined by one pattern like a hole pattern, a positive type resist has been used for writing. If, on the other hand, dimensions are determined between two patterns like isolation and gate patterns, a negative type resist is used for writing to make a removed portion a pattern.

FIG. 18A and FIG. 18B are sectional views of process for pattern formation in which a negative type resist is used and a portion where a resist is removed is made a pattern.

As shown in FIG. 18A, the one pattern 334 formed by using the first and second shaping aperture plates and having the dimension $L_1$ as shown in FIG. 14 is written (exposed) by the electron beam 350 on a negative type resist 362 formed on the substrate 360 such as a mask blank. Then, an exposed portion is removed by development. A resist pattern of the pattern dimension $L_1$ as shown in FIG. 18B can thereby be formed. Using a negative type resist can eliminate a position error factor.

It has been necessary, as described above, to use two types of resist, each of which for each purpose. However, using two types of resist has caused many problems shown below.

First, using two types of resist in one process has complicated maintenance and management of the process. As a result, problems such as an operational error being more likely to be invited have been caused. Moreover, an increase in maintenance costs of the line thereof has resulted. As a result, problems such as being a factor of cost increases of a semiconductor apparatus have been caused.

Second, when a negative type resist is used, there has been a problem of swelling and also a problem of difficulty of forming a finer pattern. Thus, there has been a problem that it will be difficult to form a pattern as patterns become increasingly more microscopic in the future. Also, there has been a problem for some type of negative type chemically amplified resist to be more likely to cause waste, creating a problem of causing yield deterioration during pattern formation.

Third, if a negative type resist is used for forming a gate pattern when directly writing on a wafer, an active part of a transistor will be irradiated with electrons. Thus, there is a problem of damage to the transistor.

Here, though not directly related to electron beam writing, a device for forming many identical patterns of the same pitch on a liquid crystal substrate by exposure of light at a time has been disclosed. The device has a first mask having a plurality of openings formed thereon and a second mask having a plurality of openings formed thereon, and light that has passed through the openings of both masks is used for exposure (Refer, for example, to Japanese Unexamined Patent Application Publication No. 2006-145746).

As has been described above, there has been a problem that a dimension error is large for pattern formation in which a positive type resist is used and a portion where a resist is removed is made a pattern. If a negative type resist is used, on the other hand, there has been a problem that other problems described above are caused.

BRIEF SUMMARY OF THE INVENTION

An object of the invention is to provide a writing apparatus that causes a decrease in dimension error even for pattern formation in which a portion where a resist is left is made a pattern and a writing method using the device.

A charged particle beam writing apparatus according to an embodiment of the present invention includes:

an irradiation part configured to irradiate a charged particle beam;

a first shaping aperture member having passing areas, that the charged particle beam passes through, on both sides of an area blocking the charged particle beam;

a deflection part configured to deflect the charged particle beam that has passed through the first shaping aperture member;

a second shaping aperture member having passing areas, that the charged particle beam passes through, on both sides of an area blocking the deflected charged particle beam; and a stage on which a target workpiece irradiated with the charged particle beam that has passed through the second shaping aperture member is placed.

A charged particle beam writing method according to an embodiment of the present invention includes:

writing first and second patterns placed side by side with predetermined spacing by using first and second shaping aperture members in which openings, that a charged particle beam passes through, are formed on both sides of an area blocking the charged particle beam; and writing a third pattern to be connected to the second pattern by using the first and second shaping aperture members, between both sides of the second pattern, on the side opposite to the first pattern.

A charged particle beam writing method according to an embodiment of the present invention includes:

writing a first pair of patterns placed side by side with first spacing by using first and second shaping aperture members in which openings, that a charged particle beam passes through, are formed on both sides of an area blocking the charged particle beam; and writing a second pair of patterns placed side by side with second spacing and connected to the first pair of patterns by using the first and second shaping aperture members.

BRIEF DESCRIPTION OF THE WRITINGS

Figure 14:
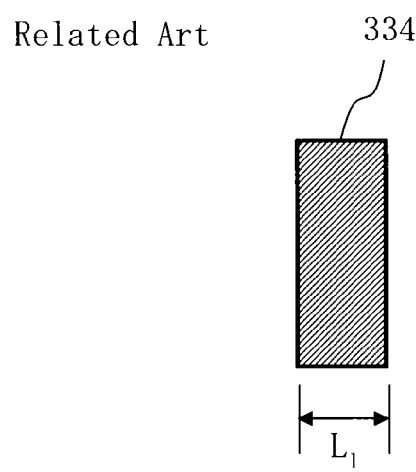

FIG. 14 exemplifies a pattern formed by one shot.

Figure 15A:
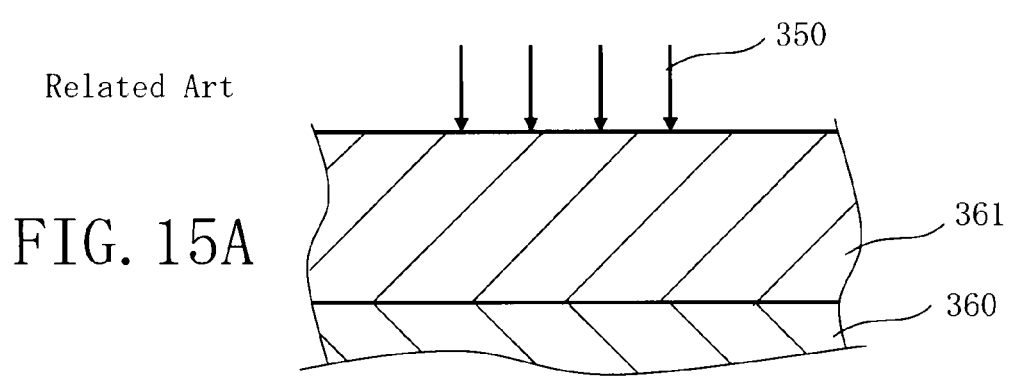
Figure 15B:
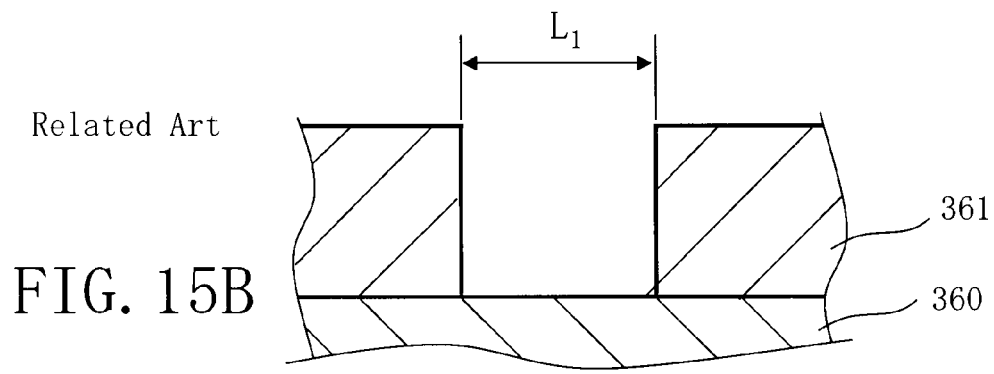

FIG. 15A and FIG. 15B are sectional views of process for pattern formation in which a positive type resist is used and a portion where a resist is removed is made a pattern.

Figure 16:
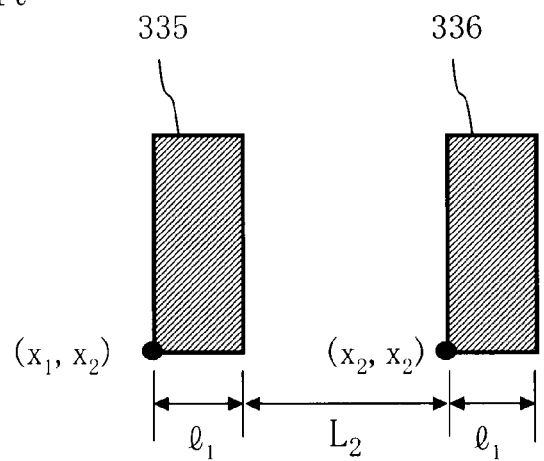

FIG. 16 exemplifies a pattern formed by two shots.

FIG. 17A and FIG. 17B are sectional views of process for pattern formation in which a positive type resist is used and a portion where a resist is left is made a pattern.

FIG. 18A and FIG. 18B are sectional views of process for pattern formation in which a negative type resist is used and a portion where a resist is removed is made a pattern.

Figure 19B:
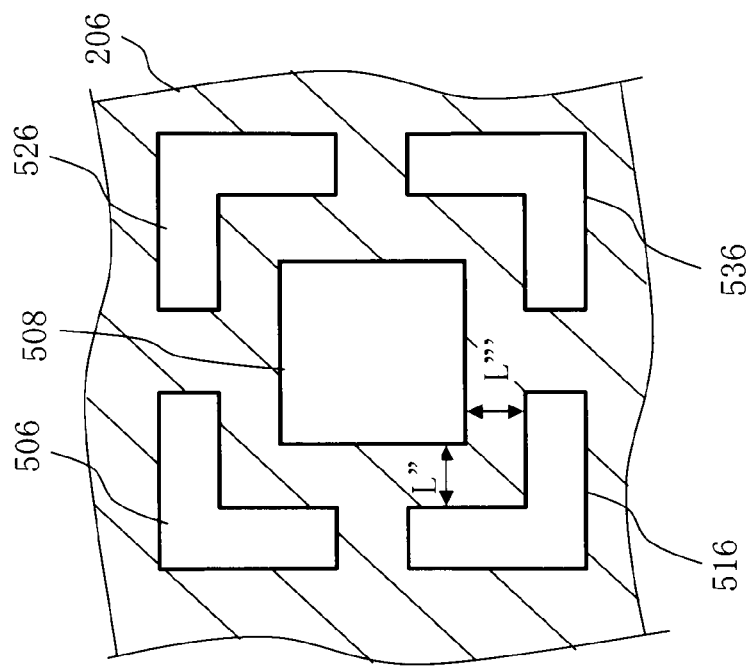
Figure 19A:
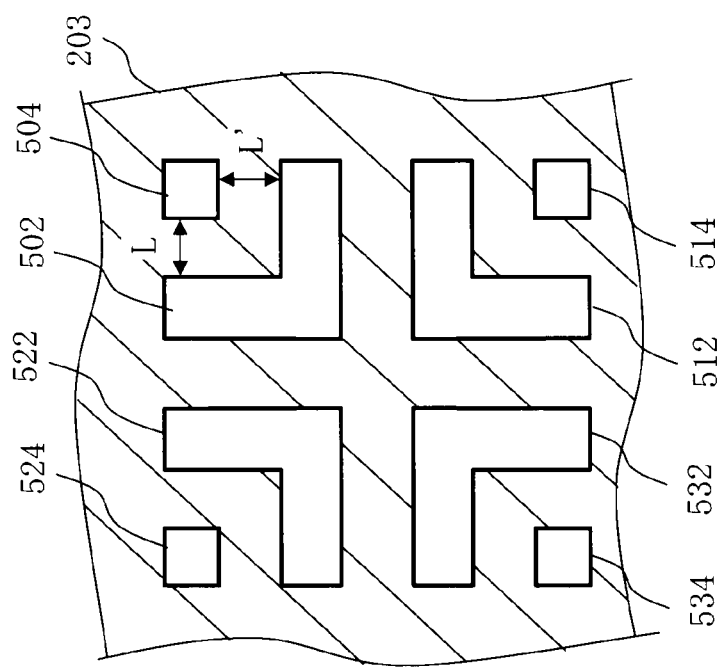

FIG. 19A and FIG. 19B are diagrams showing an example of openings formed in shaping aperture members in a second embodiment.

Figure 20:
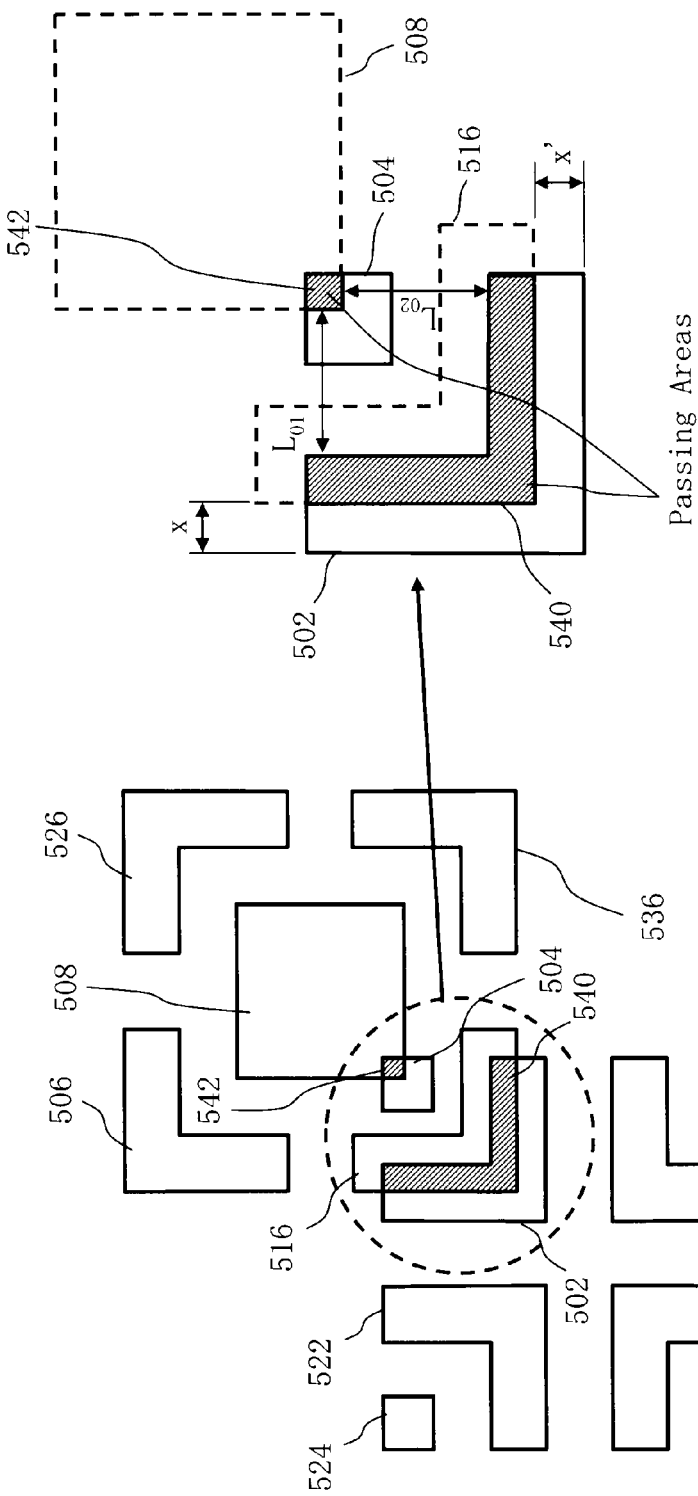

FIG. 20 is a diagram showing an example of patterns formed by the shaping aperture members in FIG. 19A and FIG. 19B.

Figure 21:
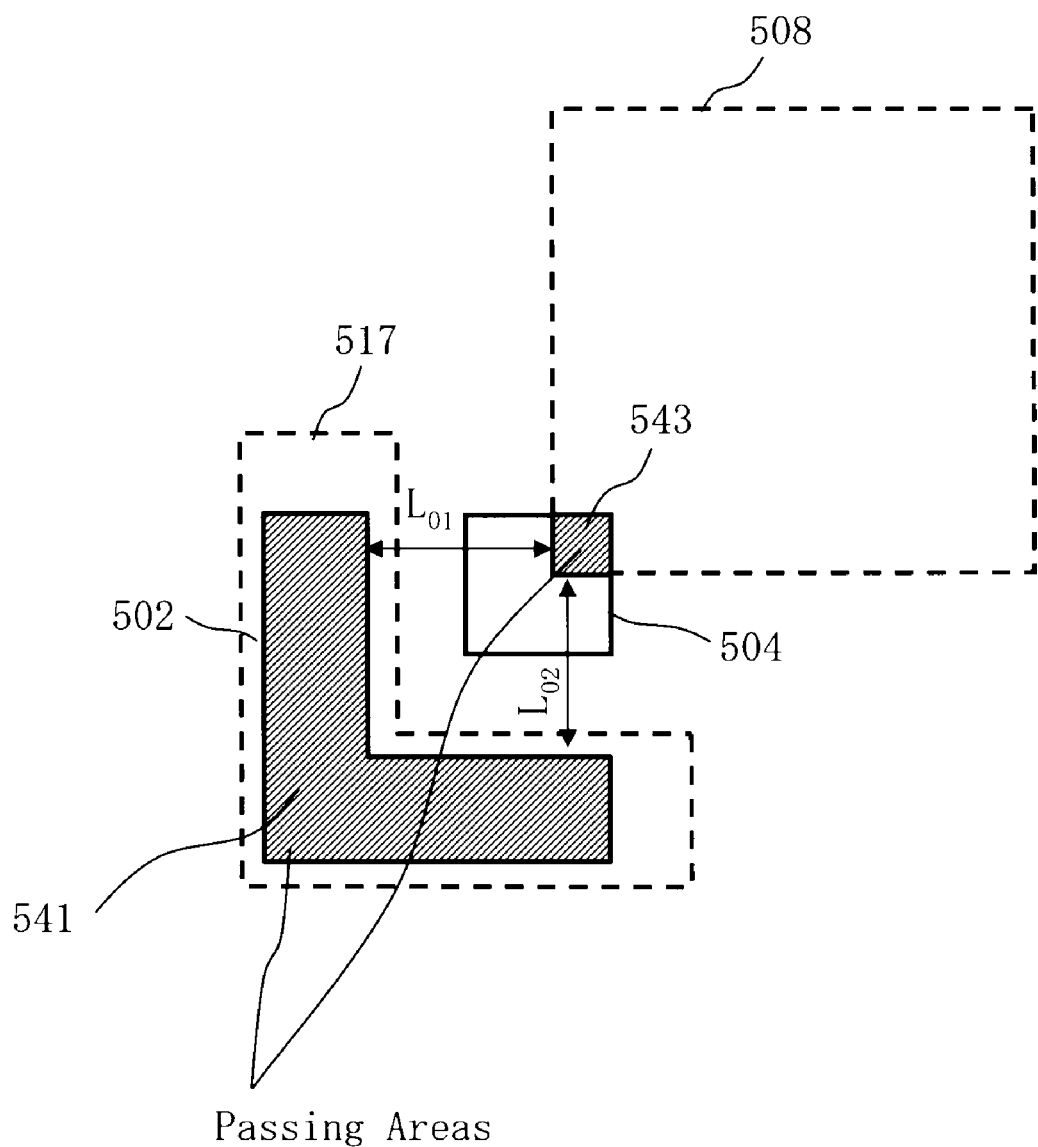

FIG. 21 is a diagram showing an example of patterns formed in other shaping aperture members in the second embodiment.

Figure 22B:
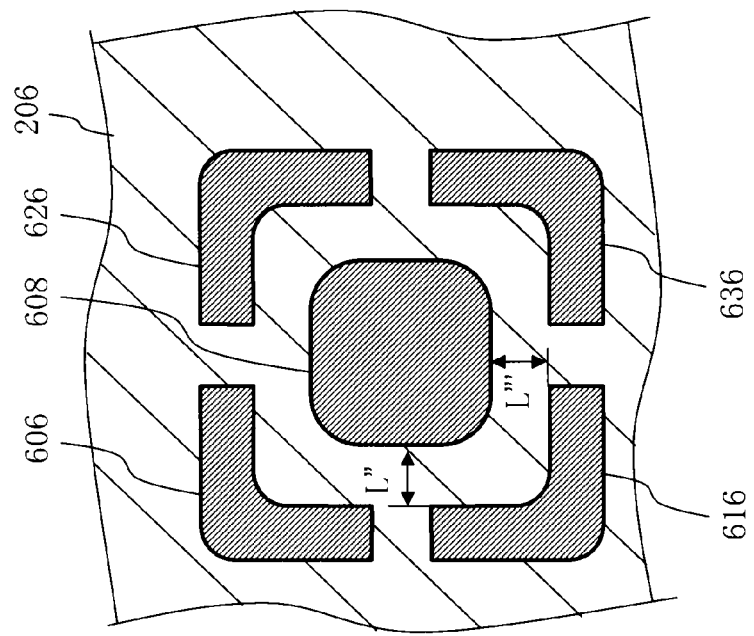
Figure 22A:
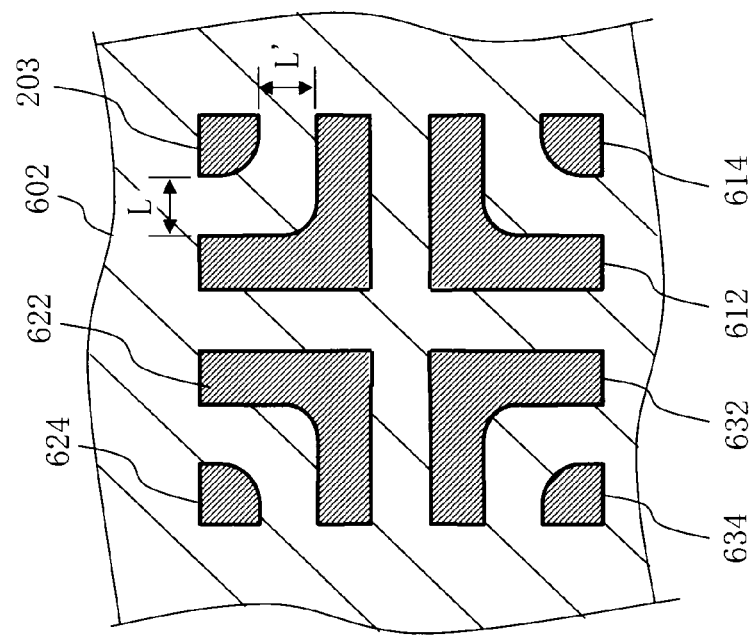

FIG. 22A and FIG. 22B are diagrams showing another example of openings formed in the shaping aperture members in the second embodiment.

Figure 23:
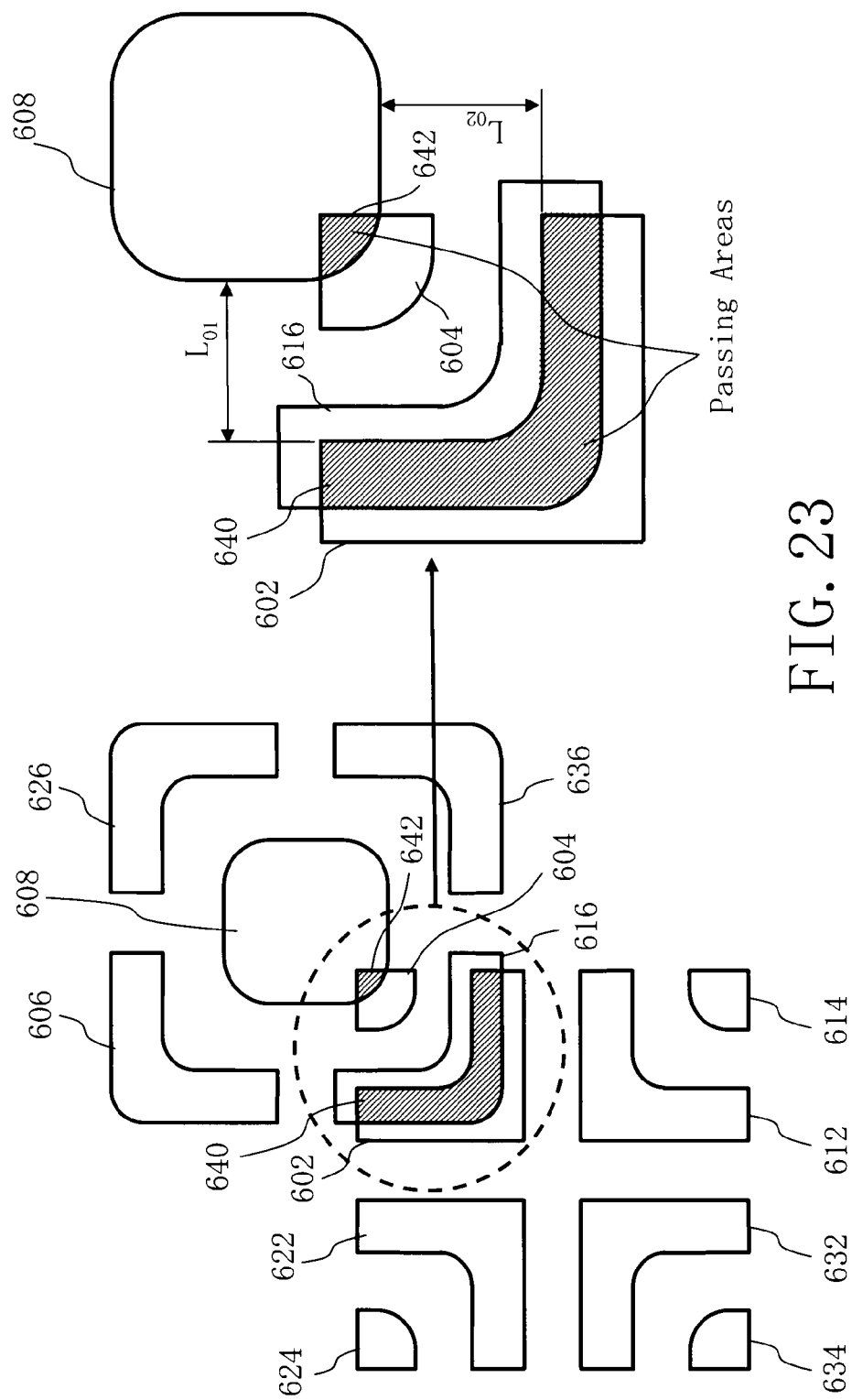

FIG. 23 is a diagram showing an example of patterns formed by the shaping aperture members in FIG. 22A and FIG. 22B.

DETAILED DESCRIPTION OF THE INVENTION

In the embodiment shown below, a configuration using an electron beam as an example of a charged particle beam will be described. However, the charged particle beam is not limited to the electron beam and a beam of charged particles such as ions may also be used.

Embodiment 1

Figure 1:
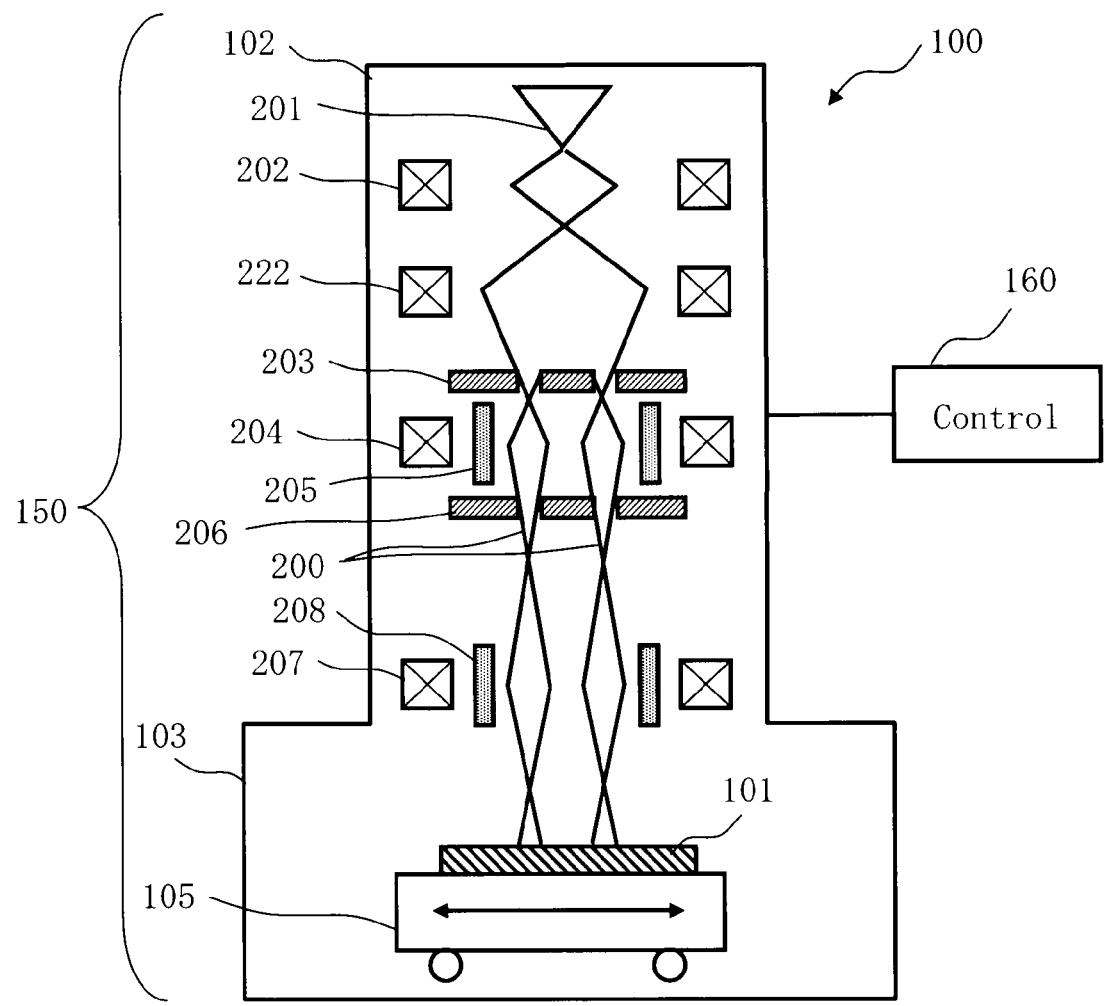
FIG. 1 is a conceptual diagram exemplifying a principal part configuration of a writing apparatus in a first embodiment.

FIG. 1 is a conceptual diagram exemplifying the principal part configuration of a writing apparatus in the first embodiment.

In FIG. 1, a writing apparatus 100 is an example of a charged particle beam writing apparatus. The writing apparatus 100 writes, or "draws" a predetermined pattern on a target workpiece 101. The writing apparatus 100 comprises a writing part 150 and a control part 160. The writing part 150 has an electron lens barrel 102 and a writing chamber 103. Inside the electron lens barrel 102, an electron gun 201, an illuminating lens 202, a projecting lens 222, a first shaping aperture plate 203 (an example of an aperture member), a projecting lens 204, a shaping deflector 205 (an example of a deflection part), a second shaping aperture plate 206 (an example of an aperture member), an objective lens 207, and a position deflector 208 are arranged. The electron gun 201 is an example of an irradiation part. An XY stage 105 movably arranged is arranged inside the writing chamber 103. The target workpiece 101 is arranged on the XY stage 105. The target workpiece 101 includes, for example, mask blanks to which a resist film on which no pattern is formed is applied. FIG. 1 shows only components necessary for describing the first embodiment. The writing apparatus 100 may contain other components.

Figure 2A:
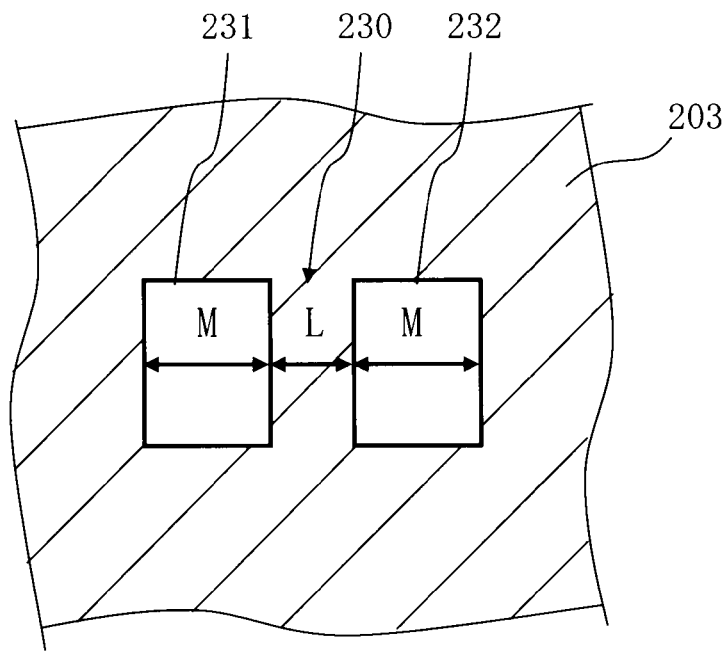
FIG. 2A and FIG. 2B are diagrams showing an example of openings formed in shaping aperture plates in the first embodiment.
Figure 2B:
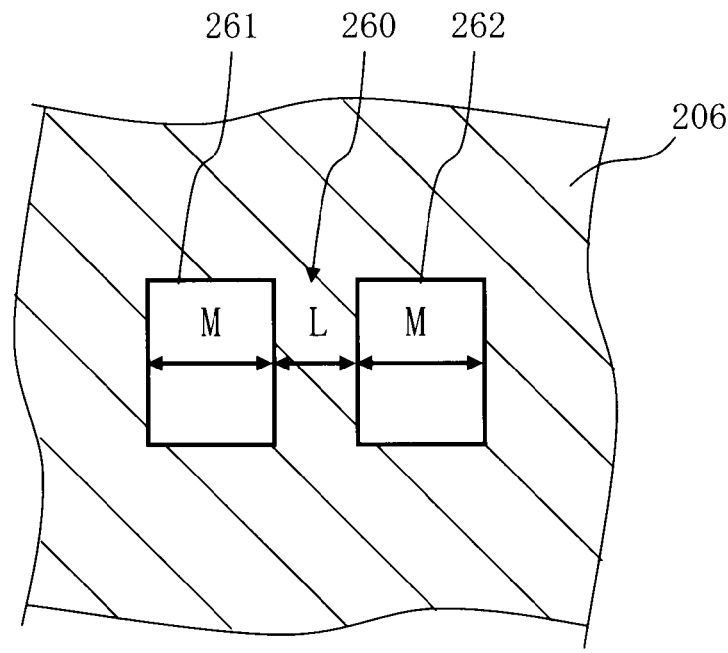

FIG. 2A and FIG. 2B are diagrams showing an example of openings formed in shaping aperture plates in the first embodiment.

In FIG. 2A, an example of openings formed in the first shaping aperture plate 203 is shown. In FIG. 2B, an example of openings formed in the second shaping aperture plate 206 is shown. As shown in FIG. 2A, openings 231 and 232 of two rectangles formed with an opening width M are formed as passing areas, that an electron beam 200 passes through, on both sides of an area blocking the electron beam 200. The openings 231 and 232 are formed parallel by providing an area 230 of spacing L between the openings for blocking the electron beam 200. Particularly, edges facing each other are formed parallel. Similarly, as shown in FIG. 2B, openings 261 and 262 of two rectangles formed with the opening width M are formed as passing areas on both sides of an area blocking the electron beam 200. The openings 261 and 262 are formed parallel by providing an area 260 of the spacing L between the openings for blocking the electron beam 200. Particularly, edges facing each other are formed parallel. That is, both shaping aperture plates have a non-passage portion sandwiched by portions on both sides through which the electron beam 200 passes.

The electron beam 200 irradiated, or "shone" from the electron gun 201 (an example of an irradiation part) illuminates the whole first shaping aperture plate 203, in which the aforementioned openings 231 and 232 (holes) of the two rectangles are formed, through the illuminating lens 202 and the projecting lens 222. Here, the electron beam 200 is first formed into two rectangles. Then, the electron beam 200 of two first aperture images after passing through the first shaping aperture plate 203 is projected onto the second shaping aperture plate 206 by the projecting lens 204. Positions of the two first aperture images on the second shaping aperture plate 206 are controlled by the images being similarly deflected by the shaping deflector 205. Accordingly, beam forms and dimensions of both images can be changed. Then, the electron beam 200 of two second aperture images after passing through the second shaping aperture plate 206 is focused by the objective lens 207. Then, the electron beam 200 of each image is similarly deflected by the position deflector 208. In this manner, pattern images to be a pair at desired positions of the target workpiece 101 on the XY stage 105 are shone.

Figure 3A:
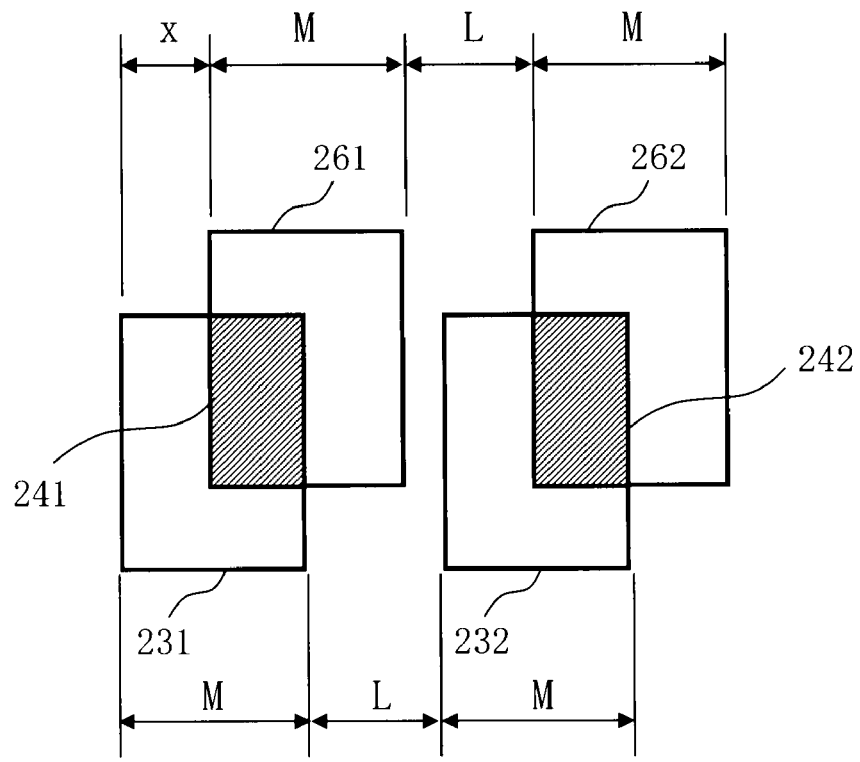
FIG. 3A and FIG. 3B are diagrams showing an example of patterns formed by the shaping aperture plates in the first embodiment.
Figure 3B:
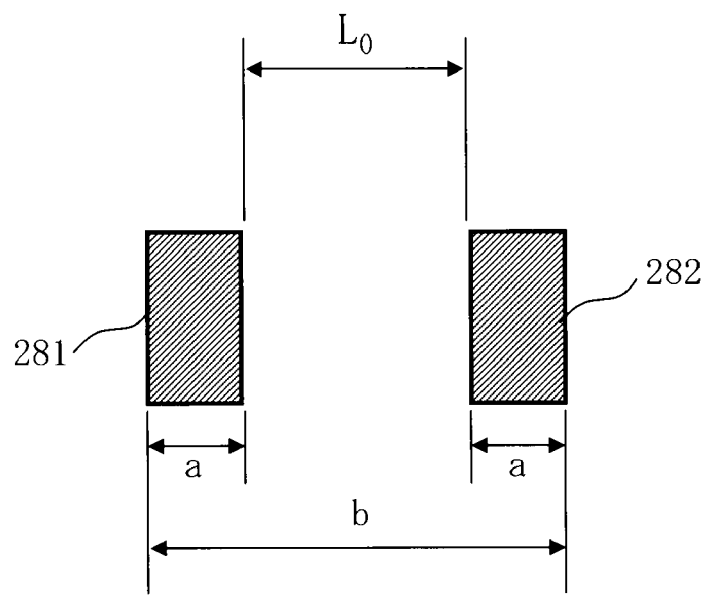

FIG. 3A and FIG. 3B are diagrams showing an example of patterns formed by the shaping aperture plates in the first embodiment.

FIG. 3A shows a portion 241 through which the electron beam 200 passes when the electron beam 200 passes through both the opening 231 and the opening 261. Similarly, a portion 242 through which the electron beam 200 passes when the electron beam 200 passes through both the opening 232 and the opening 262 is shown. Then, in FIG. 3A, the beam form and size are determined by relatively shifting the first shaping aperture plate 203 and the second shaping aperture plate 206 in a lateral direction (x direction) by a dimension x. Then, as shown in FIG. 3B, a pattern 281 is formed into a shape of the portion 241. Similarly, a pattern 282 is formed into a shape of the portion 242. Here, the dimension between the two patterns 281 and 282 is defined as $L_0$. Also, the dimension of the two patterns 281 and 282 is defined as a. In this case, $L_0$ is given by $L_0=L+x=L+M-(M-x)$. Also, a is given by $a=M-x$ and b by $b=L+2M-x$. The dimension $L_0$ is determined, as shown above, by an amount of deflection of the shaping deflector 205, or equivalently, the amount x of shifting. Thus, the dimension $L_0$ is not dependent on a deflecting position of the position deflector 208. Consequently, dimensional accuracy is determined solely by a shaping deflection error and a position error can be excluded. That is, if $x=<x>+\delta x$ is set by assuming that a value $\delta x$ of x deviating from the average value $<x>$ is probabilistically calculated, and a value of $L_0$ deviating from the average value $<L_0>$ is defined as $\delta L_0$, the average value of the square of an error is given by $<\delta L_0^2>=<x^2>$. Thus, the error of the pattern dimension $L_0$ is given by: shaping deflection error$=\sqrt{<\delta x^2>}$. Therefore, a position error that has conventionally occurred can be eliminated even for pattern formation in which a positive type resist is used and a left pattern is formed. Consequently, a left pattern formed by a portion where a resist is left using a positive type resist can be formed with high-precision dimensions without using a negative type resist.

Here, though, in the above example, a plurality of openings is formed in both the first and second shaping aperture plates, the present embodiment is not limited to this. For example, openings shown below may also be suitably formed.

Figure 4A:
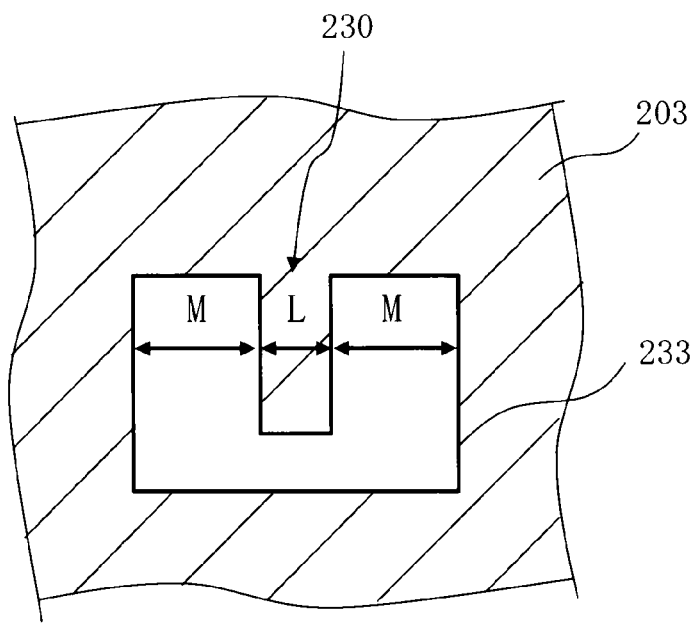
FIG. 4A and FIG. 4B are diagrams showing another example of openings formed in the shaping aperture plates in the first embodiment.
Figure 4B:
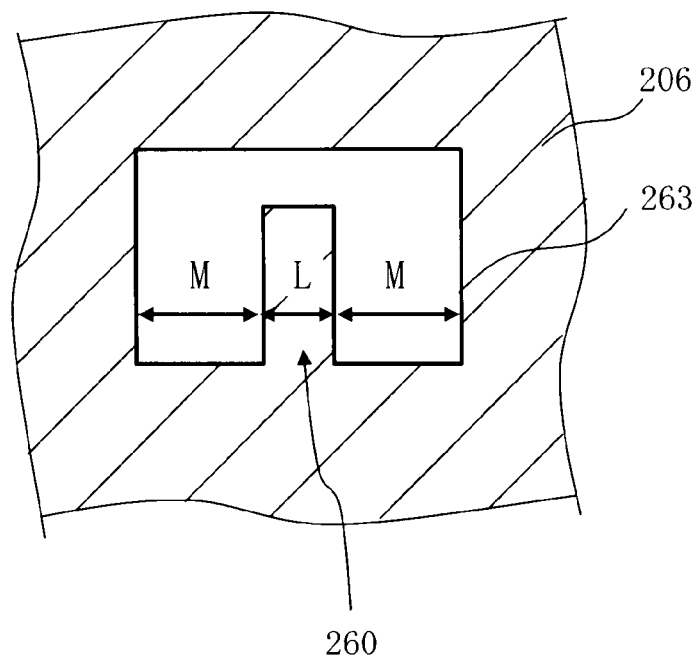

FIG. 4A and FIG. 4B are diagrams showing another example of openings formed in the shaping aperture plates in the first embodiment.

In FIG. 4A, another example of an opening formed in the first shaping aperture plate 203 is shown. In FIG. 4B, another example of an opening formed in the second shaping aperture plate 206 is shown. As shown in FIG. 4A, one opening 233 in a shape like " ⊐ "in Japanese, a so-called " ⊐ "letter shape is formed by connecting ends of two rectangular openings formed with the opening width M. In this manner, portions of passing areas through which an electron beam passes are connected. Portions of both legs (two rectangular portions formed with the opening width) of the opening 233 are formed as passing areas, that the electron beam 200 passes through, on both sides of an area blocking the electron beam 200. The opening 233 is formed in such a way that portions of both legs are parallel by providing the area 230 of spacing L between portions of both legs for blocking the electron beam 200. Similarly, as shown in FIG. 4B, one opening 263 in the so-called "" ⊐ "letter shape is formed by connecting ends of two rectangular openings formed with the opening width M. In this manner, portions of passing areas through which an electron beam passes are connected. Portions of both legs (two rectangular portions formed with the opening width) of the opening 263 are formed as passing areas, that the electron beam 200 passes through, on both sides of an area blocking the electron beam 200. The opening 263 is formed in such a way that portions of both legs are parallel by providing the area 260 of spacing L between portions of both legs for blocking the electron beam 200. That is, both shaping aperture plates have a non-passage portion sandwiched by portions on both sides through which the electron beam 200 passes.

Figure 5:
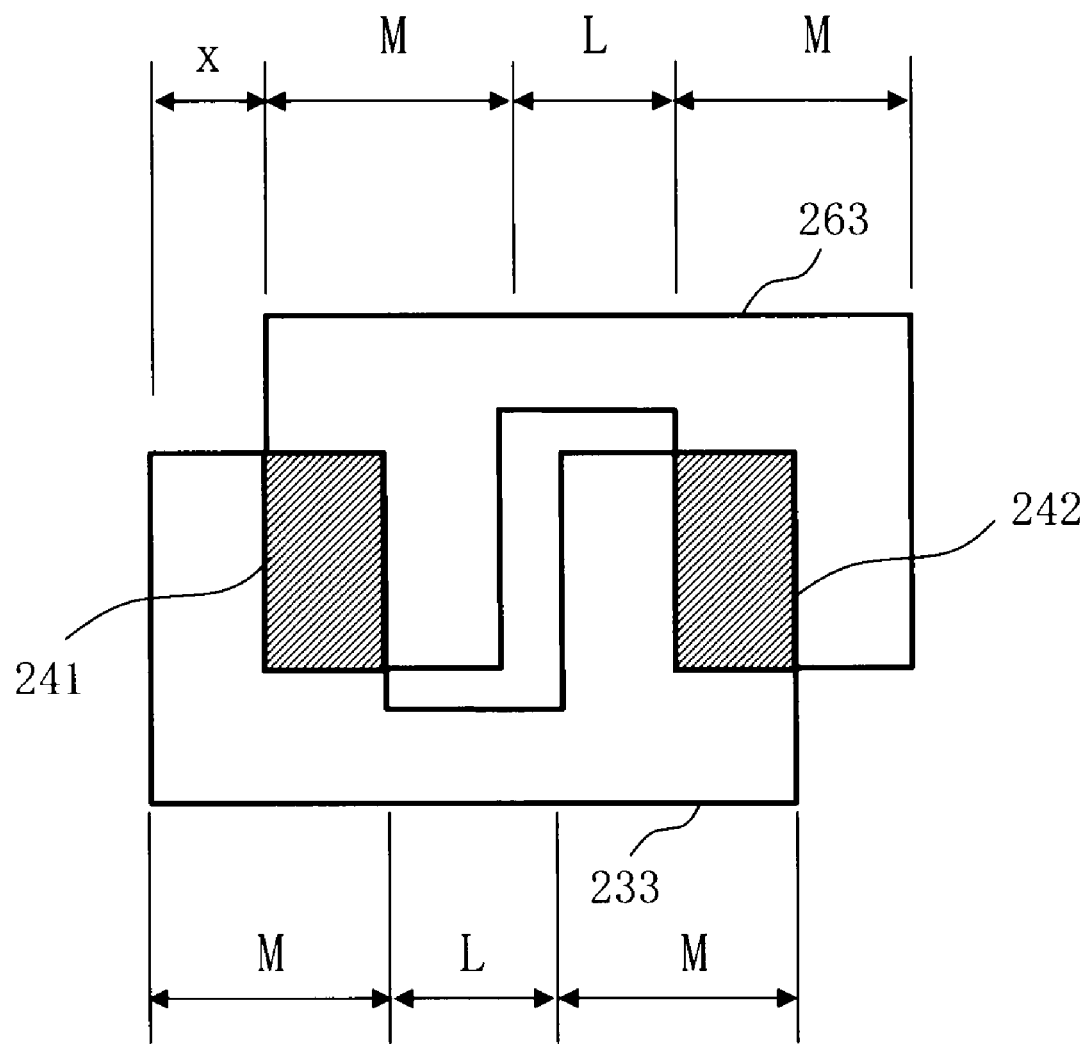
FIG. 5 is a diagram showing an example of patterns formed by the shaping aperture plates in FIG. 4A and FIG. 4B.

FIG. 5 is a diagram showing an example of patterns formed by the shaping aperture plates in FIG. 4A and FIG. 4B.

FIG. 5 shows the portions 241 and 242 through which the electron beam 200 passes when the electron beam 200 passes through both the opening 233 and the opening 263. Then, in FIG. 5, like in FIG. 3A, the beam form and size are determined by relatively shifting the first shaping aperture plate 203 and the second shaping aperture plate 206 in the lateral direction (x direction) by the dimension x. Like in FIG. 3B, the pattern 281 is determined in the shape of the portion 241 even if there is only one opening. Similarly, the pattern 282 is determined in the shape of the portion 242. Here, the dimension between the two patterns 281 and 282 is $L_0$. Then, an error of the pattern dimension $L_0$ is given by: shaping deflection error=$\sqrt{<\delta x^2>}$.

Here, though, in the above example, an opening in the " ⊐ "letter shape is formed in both the first and second shaping aperture plates, the present embodiment is not limited to this. For example, an opening in the "" ⊐ " letter shape may suitably be formed at least in one of the first and second shaping aperture plates. If, for example, the opening in the " ⊐ "letter shape is formed in the second shaping aperture plate 206, a plurality of openings is suitably formed in the first shaping aperture plate 203. If the opening in the " ⊐ "letter shape is formed in the first shaping aperture plate 203, a plurality of openings is suitably formed in the second shaping aperture plate 206.

As has been described above, a plurality of openings is suitably formed in the first shaping aperture plate 203. Or, a plurality of openings is suitably formed in the second shaping aperture plate 206. Or, a plurality of openings is suitably formed in both the first and second shaping aperture plates.

Here, though, in the above examples, formed openings are not tilted in both the first and second shaping aperture plates, the present embodiment is not limited to this. For example, openings shown below may also be suitably formed.

Figure 6A:
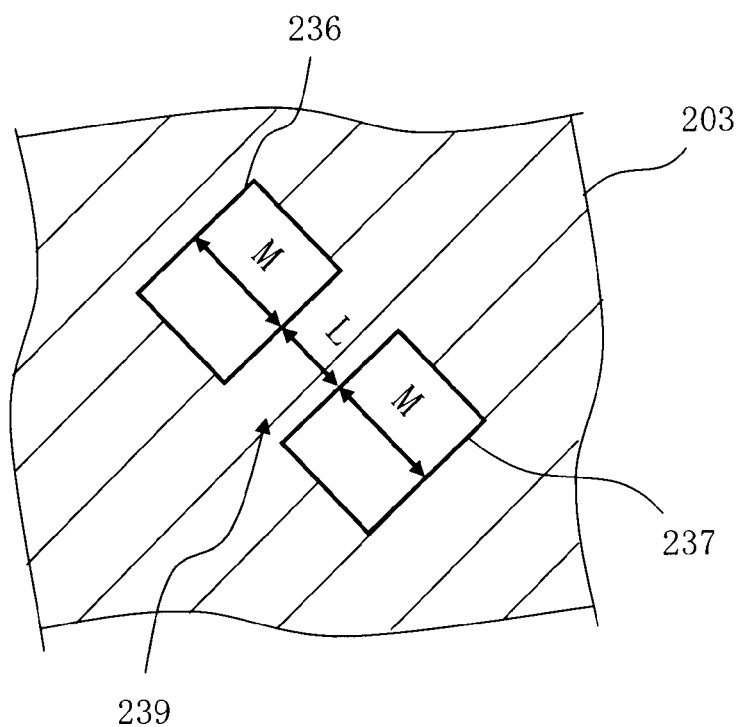
FIG. 6A and FIG. 6B are diagrams showing another example of openings formed in the shaping aperture plates in the first embodiment.
Figure 6B:
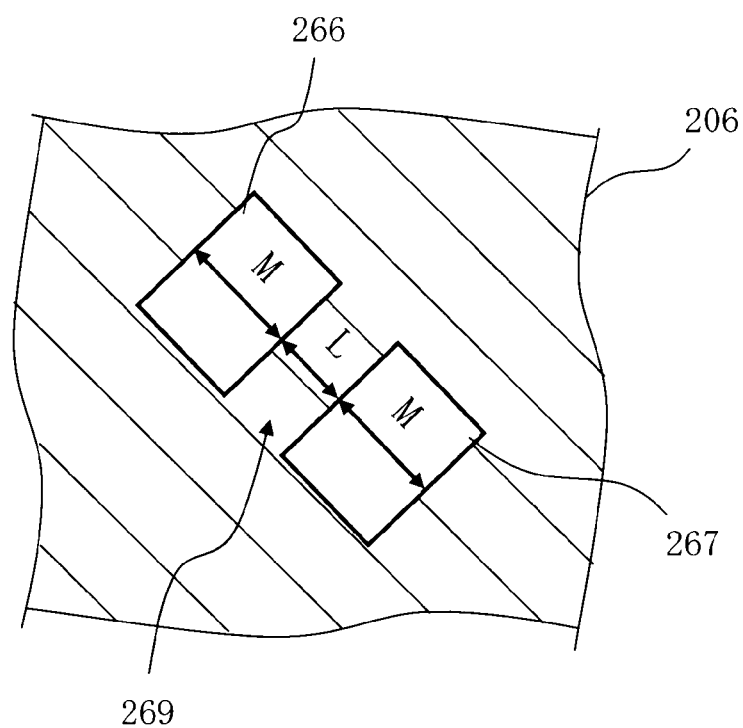

FIG. 6A and FIG. 6B are diagrams showing another example of openings formed in the shaping aperture plates in the first embodiment.

In FIG. 6A, another example of openings formed in the first shaping aperture plate 203 is shown. In FIG. 6B, another example of openings formed in the second shaping aperture plate 206 is shown. As shown in FIG. 6A, openings 236 and 237 of two rectangles formed with the opening width M and tilted at a predetermined angle are formed as passing areas, that the electron beam 200 passes through, on both sides of an area blocking the electron beam 200. The openings 236 and 237 are formed parallel by providing an area 239 of the spacing L between the openings for blocking the electron beam 200. Particularly, edges facing each other are formed parallel. Similarly, as shown in FIG. 6B, openings 266 and 267 of two rectangles formed with the opening width M and tilted at a predetermined angle are formed as passing areas, that the electron beam 200 passes through, on both sides of an area blocking the electron beam 200. The openings 266 and 267 are formed parallel by providing an area 269 of the spacing L between the openings for blocking the electron beam 200. Particularly, edges facing each other are formed parallel. That is, both shaping aperture plates have a non-passage portion sandwiched by portions on both sides through which the electron beam 200 passes.

Figure 7A:
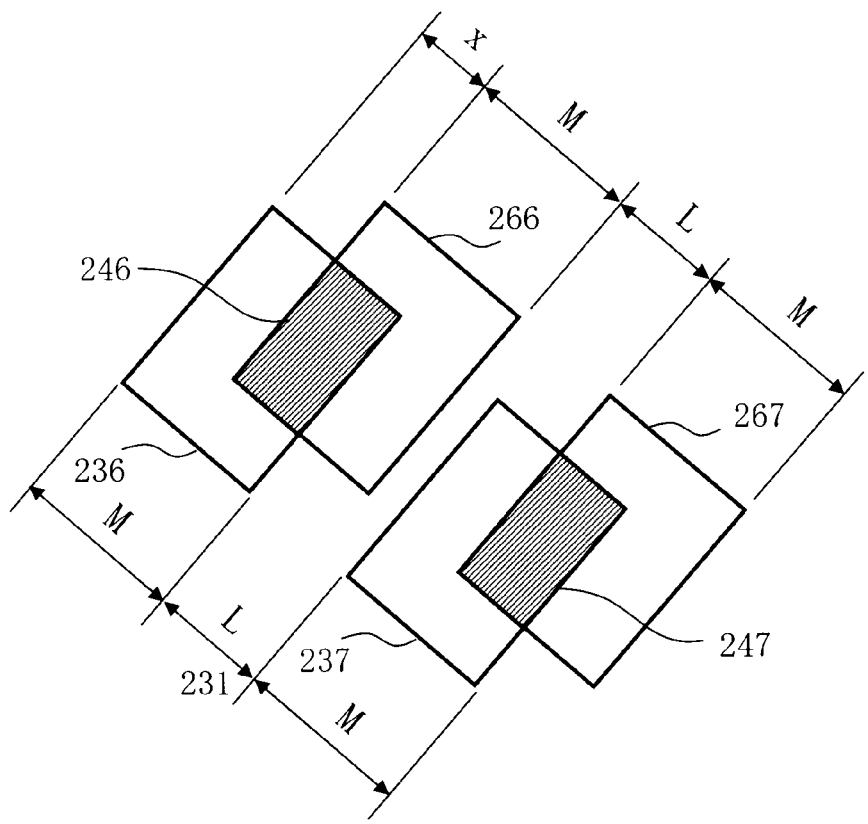
FIG. 7A and FIG. 7B are diagrams showing an example of patterns formed by the shaping aperture plates in FIG. 6A and FIG. 6B.
Figure 7B:
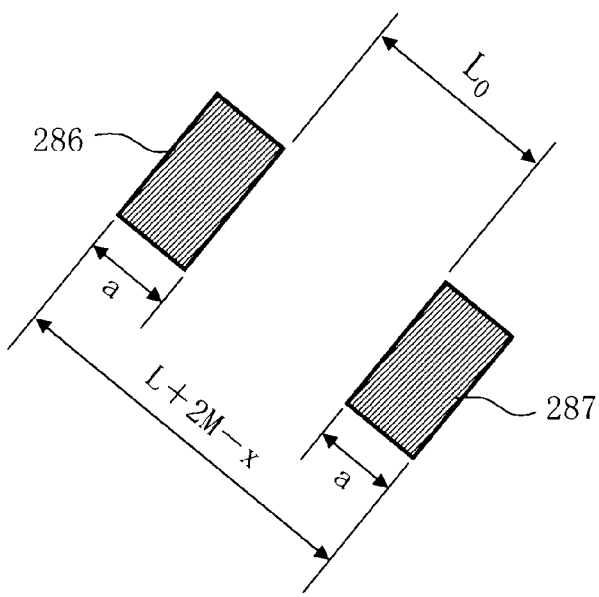

FIG. 7A and FIG. 7B are diagrams showing an example of patterns formed by the shaping aperture plates in FIG. 6.

FIG. 7A shows a portion 246 through which the electron beam 200 passes when the electron beam 200 passes through both the opening 236 and the opening 266. Similarly, a portion 247 through which the electron beam 200 passes when the electron beam 200 passes through both the opening 237 and the opening 267 is shown. Then in FIG. 7A, the beam form and size are determined by relatively shifting the first shaping aperture plate 203 and the second shaping aperture plate 206 in the same direction as that of the width dimension M by the dimension x. Then, as shown in FIG. 7B, a pattern 286 is formed into a shape of the portion 246. Similarly, a pattern 287 is formed into a shape of the portion 247. Here, the dimension between the two patterns 286 and 287 is $L_0$. Then, an error of the pattern dimension $L_0$ is given by: shaping deflection error=$\sqrt{(\delta x^2)}$.

Here, though, in the above example, all angles of openings formed in both the first and second shaping aperture plates are right angles, the present embodiment is not limited to this. For example, openings shown below may also be suitably formed.

Figure 8A:
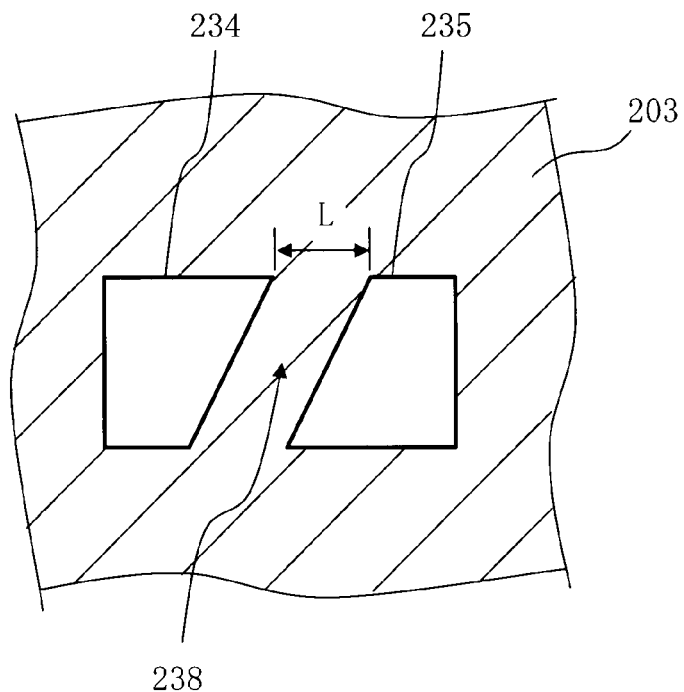
FIG. 8A and FIG. 8B are diagrams showing another example of openings formed in the shaping aperture plates in the first embodiment.
Figure 8B:
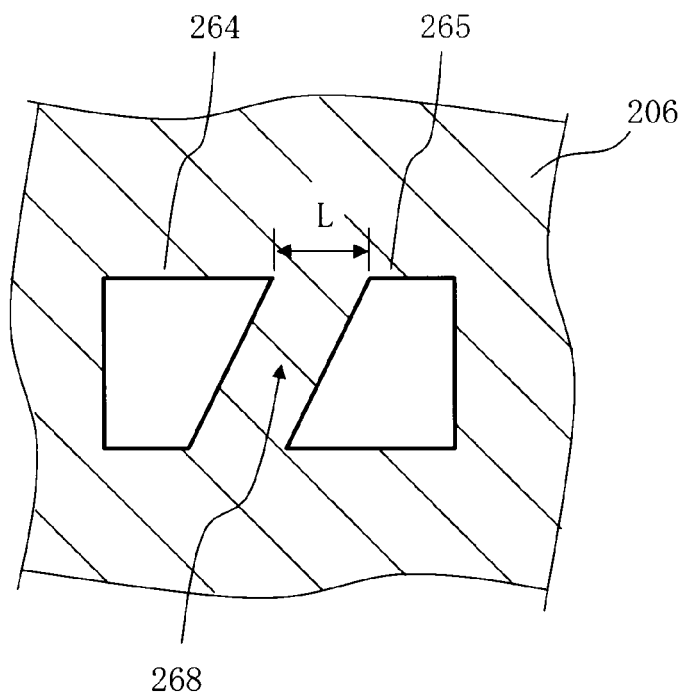

FIG. 8A and FIG. 8B are diagrams showing another example of openings formed in the shaping aperture plates in the first embodiment.

In FIG. 8A, another example of openings formed in the first shaping aperture plate 203 is shown. In FIG. 8B, another example of openings formed in the second shaping aperture plate 206 is shown. As shown in FIG. 8A, openings 234 and 235 of two trapezoids having arbitrary angles other than the right angle are formed as passing areas, that the electron beam 200 passes through, on both sides of an area blocking the electron beam 200. The openings 234 and 235 are formed with diagonal edges facing each other in parallel by providing an area 238 of the spacing L between the openings in the lateral direction (x direction) for blocking the electron beam 200. Similarly, as shown in FIG. 8B, openings 264 and 265 of two trapezoids having arbitrary angles other than the right angle are formed as passing areas, that the electron beam 200 passes through, on both sides of an area blocking the electron beam 200. The openings 264 and 265 are formed with diagonal edges facing each other in parallel by providing an area 268 of the spacing L between the openings in the lateral direction (x direction) for blocking the electron beam 200. That is, both shaping aperture plates have a non-passage portion sandwiched by portions on both sides through which the electron beam 200 passes.

Figure 9A:
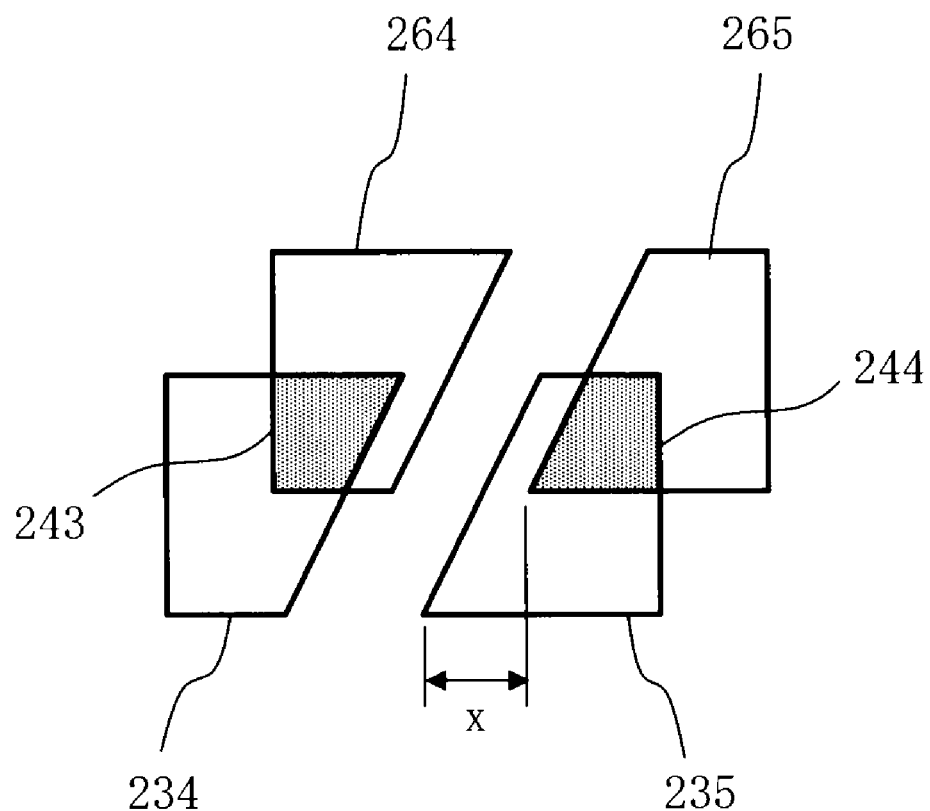
FIG. 9A and FIG. 9B are diagrams showing an example of patterns formed by the shaping aperture plates in FIG. 8A and FIG. 8B.
Figure 9B:
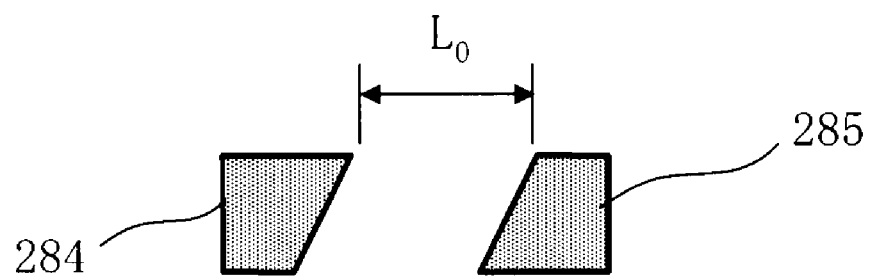

FIG. 9A and FIG. 9B are diagrams showing an example of patterns formed by the shaping aperture plates in FIG. 8A and FIG. 8B.

FIG. 9A shows a portion 244 through which the electron beam 200 passes when the electron beam 200 passes through both the opening 234 and the opening 264. Similarly, a portion 245 through which the electron beam 200 passes when the electron beam 200 passes through both the opening 235 and the opening 265 is shown. Then in FIG. 9A, the beam form and size are determined by relatively shifting the first shaping aperture plate 203 and the second shaping aperture plate 206 in the lateral direction (x direction) by the dimension x. Then, as shown in FIG. 9B, a pattern 284 is formed into a shape of the portion 244. Similarly, a pattern 285 is formed into a shape of the portion 245. Here, if the dimension between the two patterns 286 and 287 is $L_0$, an error of the pattern dimension $L_0$ is given by: shaping deflection error= $\sqrt{(\delta x^2)}$.

Further, a similar advantage can suitably be gained by forming a plurality of openings shown in FIG. 2 in one of the first shaping aperture plate 203 and the second shaping aperture plate 206 and providing one opening in the " ⊐ "letter shape shown in FIG. 4 in the other.

A method of writing continuous patterns using the writing apparatus 100 configured as described above will be described.

Figure 10A:
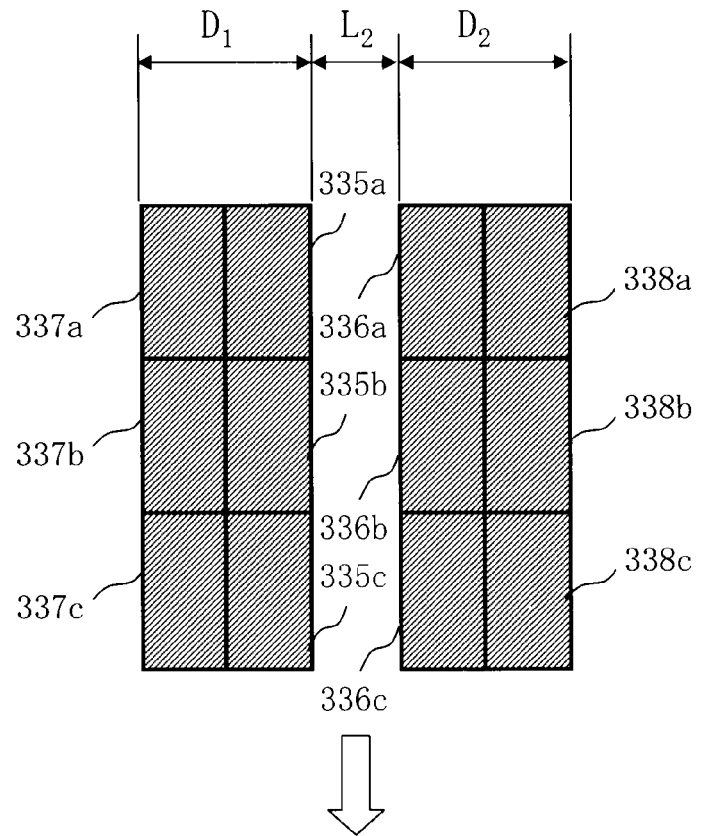
FIG. 10A and FIG. 10B are diagrams for illustrating a conventional writing technique and a writing technique in the first embodiment for writing continuous patterns at regular intervals by comparing them.
Figure 10B:
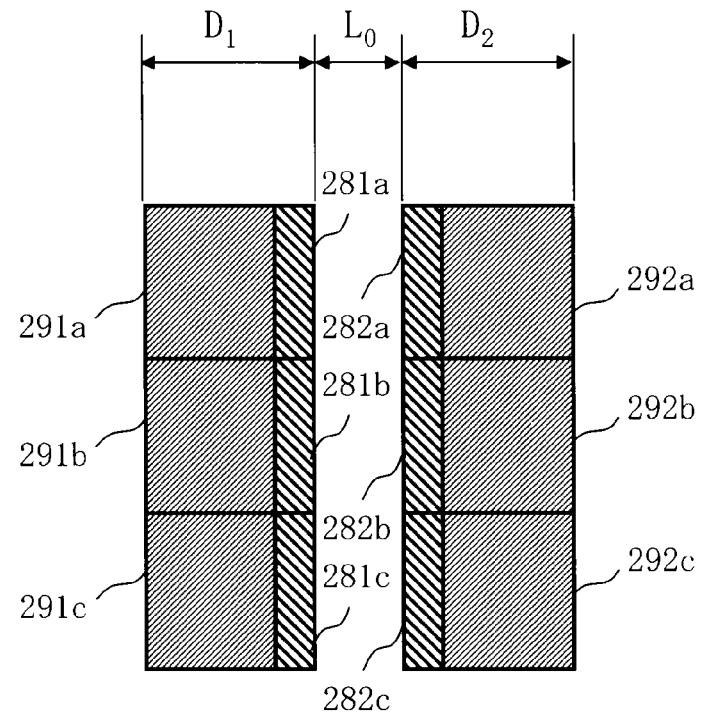

FIG. 10A and FIG. 10B are diagrams for illustrating a conventional writing technique and a writing technique in the first embodiment for writing continuous patterns at regular intervals by comparing them.

Conventionally, when patterns of widths $D_1$ and $D_2$ are formed on both sides with predetermined spacing $L_2$, as shown in FIG. 10A, the width $D_1$ is written by some patterns 335a and 337a that can be formed and independently thereof, the width $D_2$ is written by some patterns 336a and 338a that can be formed. Then, by repeating these writing steps and connecting the identical patterns (335a to 335c, 336a to 336c, 337a to 337c, and 338a to 338c), for example, in the downward direction (y direction), continuous patterns will be written. According to the conventional method, however, the spacing $L_2$ between the patterns 335 and 336 will always include, as described above, in addition to a forming error, a position error. In contrast, if patterns of the widths $D_1$ and $D_2$ are formed on both sides with predetermined spacing $L_0$ in a configuration of the first embodiment, as shown in FIG. 10B, patterns 281a and 282a to be a pair of patterns placed side by side with the spacing $L_0$ are first written using the first and second shaping aperture plates 203 and 206. Then, an auxiliary pattern 291a to be connected to the pattern 281a is written, between both sides of the pattern 281a, on the side opposite (outer side) to the pattern 282a using the first and second shaping aperture plates 203 and 206. That is, a pattern of the width $D_1$ is configured by the pattern 281a and the auxiliary pattern 291a. Similarly, an auxiliary pattern 292a to be connected to the pattern 282a is written, between both sides of the pattern 282a, on the side opposite (outer side) to the pattern 281a. That is, a pattern of the width $D_2$ is configured by the pattern 282a and the auxiliary pattern 292a. Then, by repeating these writing steps and connecting the identical patterns (281a to 281c, 282a to 282c, 291a to 291c, and 292a to 292c), for example, in the downward direction (y direction), continuous patterns at regular intervals can be written. Since, in the first embodiment, a position error factor can be excluded from a dimension error between a pair of patterns, patterns can be formed with higher precision than before. In other words, a dimension error can still be reduced even for pattern formation in which a portion where a resist is left is made a pattern.

Dimensional accuracy can first be secured, as described above, by a pair of patterns. Then, insufficient portions as a pattern shape can be compensated by an auxiliary pattern.

Here, continuous patterns are not limited to those formed at regular intervals. A method of writing continuous patterns that are placed at irregular intervals will be described below.

Figure 11A:
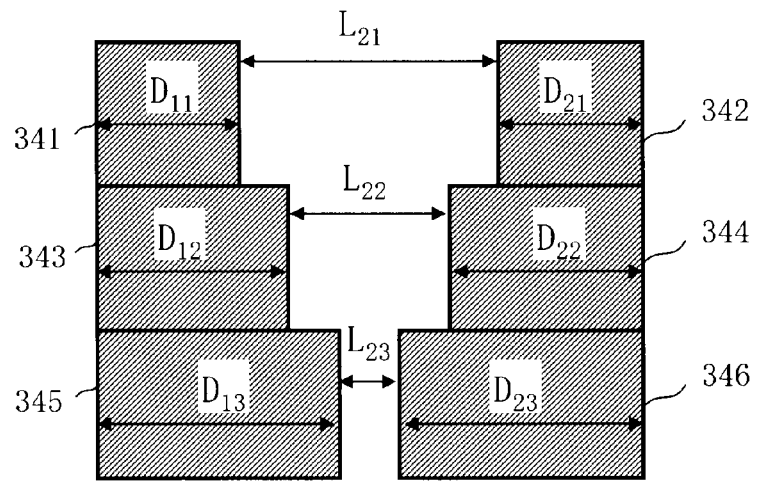
FIG. 11A and FIG. 11B are diagrams for illustrating a conventional writing technique and a writing technique in the first embodiment for writing continuous patterns at irregular intervals by comparing them.
Figure 11B:
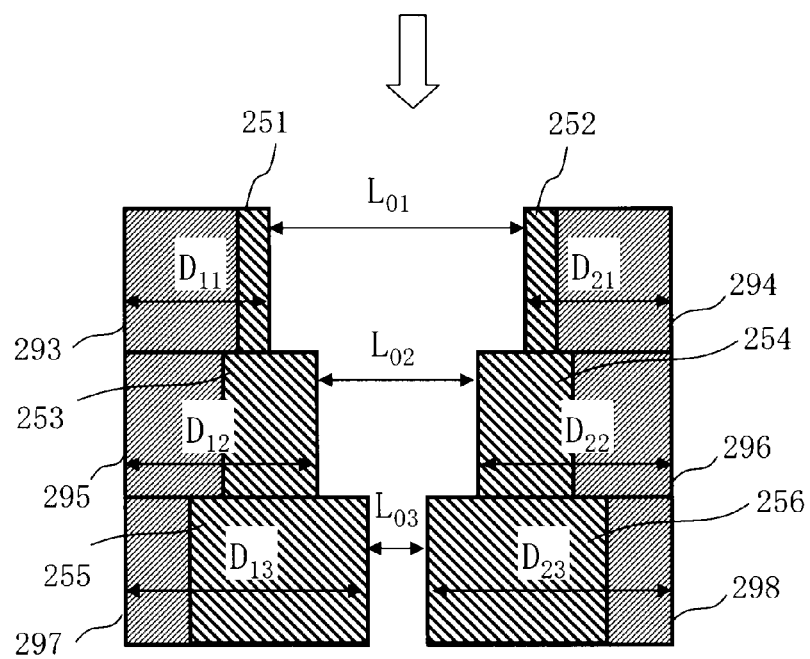
Figure 12:
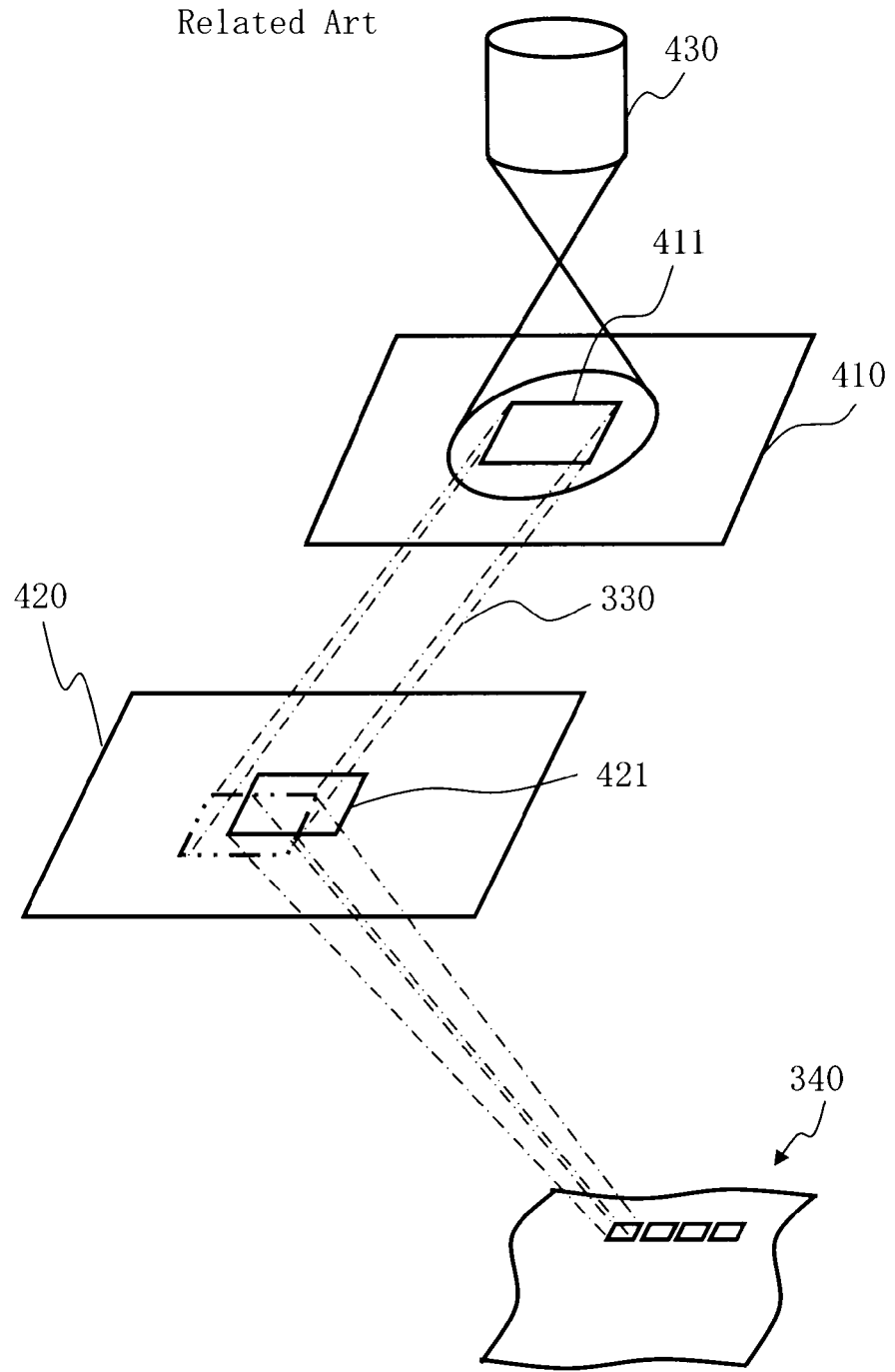
FIG. 12 is a conceptual diagram for illustrating an operation of a variable shaped electron beam writing apparatus.
Figure 13:
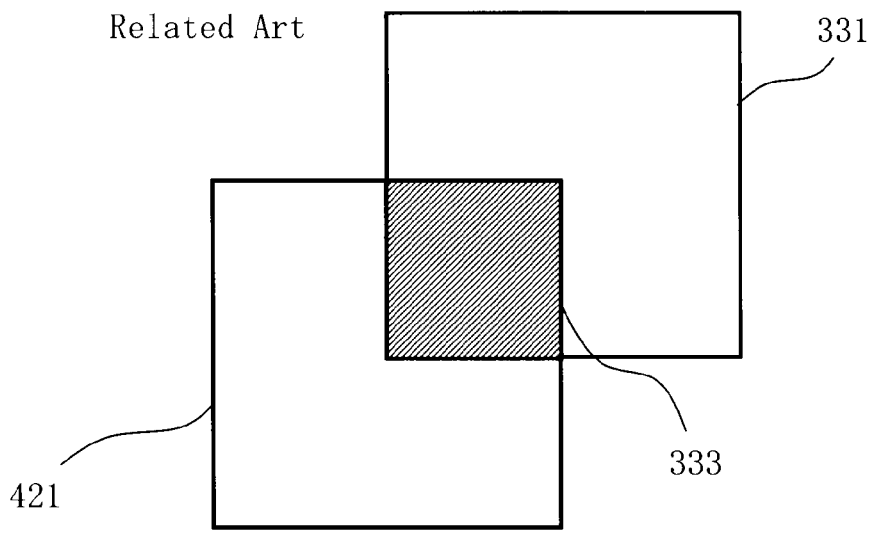
FIG. 13 is a diagram exemplifying a shaped beam.

FIG. 11A and FIG. 11B are diagrams for illustrating a conventional writing technique and a writing technique in the first embodiment for writing continuous patterns at irregular intervals by comparing them.

Conventionally, when patterns of widths $D_{11}$ and $D_{21}$ are formed on both sides with predetermined spacing $L_{21}$, as shown in FIG. 11A, if the width $D_{11}$ is formable, a pattern 341 of the width $D_{11}$ is written, and independently thereof, if the width $D_{12}$ is formable, a pattern 342 of the width $D_{12}$ is written. Then, this time, patterns of widths $D_{12}$ and $D_{22}$ are formed on both sides with predetermined spacing $L_{22}$. The formation method similarly writes, if the width $D_{12}$ is formable, a pattern 343 of the width $D_{12}$, and independently thereof writes, if the width $D_{22}$ is formable, a pattern 344 of the width $D_{22}$. Then, this time, patterns of widths $D_{13}$ and $D_{23}$ are formed on both sides with predetermined spacing $L_{23}$. The formation method similarly writes, if the width $D_{13}$ is formable, a pattern 345 of the width $D_{13}$, and independently thereof writes, if the width $D_{23}$ is formable, a pattern 346 of the width $D_{23}$. The patterns 341, 343, and 345 are formed by continuously connecting, for example, in the downward direction (y direction). Similarly, the patterns 342, 344, and 346 are formed by continuously connecting, for example, in the downward direction (y direction). According to the conventional method, however, the spacing $L_{21}$ between the patterns 341 and 342 will always include, as described above, in addition to a forming error, a position error. Similarly, the spacing $L_{22}$ between the patterns 343 and 344 will always include, as described above, in addition to a forming error, a position error. Similarly, the spacing $L_{23}$ between the patterns 345 and 346 will always include, as described above, in addition to a forming error, a position error. In contrast, if patterns of the widths $D_{11}$ and $D_{21}$ are formed on both sides with predetermined spacing $L_{01}$ in the configuration of the first embodiment, as shown in FIG. 11B, patterns 251 and 252 to be a pair of patterns placed side by side with the spacing $L_{01}$ are first written using the first and second shaping aperture plates 203 and 206. Then, an auxiliary pattern 293 to be connected to the pattern 251 is written, between both sides of the pattern 251, on the side opposite (outer side) to the pattern 252 using the first and second shaping aperture plates 203 and 206. That is, a pattern of the width $D_{11}$ is configured by the pattern 251 and the auxiliary pattern 293. Similarly, an auxiliary pattern 294 to be connected to the pattern 252 is written, between both sides of the pattern 252, on the side opposite (outer side) to the pattern 251. That is, a pattern of the width $D_{21}$ is configured by the pattern 252 and the auxiliary pattern 294. Then, this time, below the patterns 251 and 252 to be a pair, patterns of the widths $D_{12}$ and $D_{22}$ are formed on both sides with predetermined spacing $L_{02}$. The formation method is the same. Patterns 253 and 254 to be a pair of patterns placed side by side with the spacing $L_{02}$ are written using the first and second shaping aperture plates 203 and 206. Then, an auxiliary pattern 295 to be connected to the pattern 253 is written, between both sides of the pattern 253, on the side opposite (outer side) to the pattern 254 using the first and second shaping aperture plates 203 and 206. That is, a pattern of the width $D_{12}$ is configured by the pattern 253 and the auxiliary pattern 295. Similarly, an auxiliary pattern 296 to be connected to the pattern 254 is written, between both sides of the pattern 254, on the side opposite (outer side) to the pattern 253. That is, a pattern of the width $D_{22}$ is configured by the pattern 254 and the auxiliary pattern 296. Then, this time, below a pair of the patterns 253 and 254, patterns of the widths $D_{13}$ and $D_{23}$ are formed on both sides with predetermined spacing $L_{03}$. The formation method is the same. Patterns 255 and 256 to be a pair of patterns placed side by side with the spacing $L_{03}$ are written using the first and second shaping aperture plates 203 and 206. Then, an auxiliary pattern 297 to be connected to the pattern 255 is written, between both sides of the pattern 255, on the side opposite (outer side) to the pattern 256 using the first and second shaping aperture plates 203 and 206. That is, a pattern of the width $D_{13}$ is configured by the pattern 255 and the auxiliary pattern 297. Similarly, an auxiliary pattern 298 to be connected to the pattern 256 is written, between both sides of the pattern 256, on the side opposite (outer side) to the pattern 255. That is, a pattern of the width $D_{23}$ is configured by the pattern 256 and the auxiliary pattern 298. The width a of the pair of patterns 251 and 252 is determined, as described above, by a=M−x. Thus, an insufficient portion on the outer side not involved in dimensional accuracy may be compensated by the auxiliary patterns. Similarly, the width of the pair of patterns 253 and 254 is determined. Thus, an insufficient portion on the outer side not involved in dimensional accuracy may be compensated by the auxiliary patterns. Similarly, the width of the pair of patterns 255 and 256 is determined. Thus, an insufficient portion on the outer side not involved in dimensional accuracy may be compensated by the auxiliary patterns. A set of the patterns 251 and 293, that of the patterns 253 and 295, and that of the patterns 255 and 297 are continuously connected, for example, in the downward direction (y direction) for formation. Similarly, a set of the patterns 252 and 294, that of the patterns 254 and 296, and that of the patterns 256 and 298 are continuously connected, for example, in the downward direction (y direction) for formation. That is, the pair of patterns 253 and 254 is connected to, among ends of the pair of patterns 251 and 252, ends in a direction perpendicular to the direction in which the pair of patterns 251 and 252 are placed for formation. Similarly, the pair of patterns 255 and 256 is connected, among ends of the pair of patterns 253 and 254, to ends in a direction perpendicular to the direction in which the pair of patterns 253 and 254 is placed for formation. By connecting patterns following the writing steps, as described above, continuous patterns at irregular intervals can be written. Since, in the first embodiment, a position error factor can be excluded from a dimension error between a pair of patterns, patterns can be formed with higher precision than before.

Embodiment 2

In the first embodiment, a case in which the shape of an area sandwiched by two patterns formed on the target workpiece 101 by passage of a charged particle beam through openings of the first and second shaping aperture members and by which a charged particle beam is blocked has a linear shape without changing its direction at some midpoint has been described. However, the present invention is not limited to this. In a second embodiment, a case in which the shape of an area sandwiched by two patterns formed on the target workpiece 101 by passage of a charged particle beam through openings of the first and second shaping aperture members and by which a charged particle beam is blocked changes its direction at some midpoint will be described. The second embodiment is the same as the first embodiment except the shapes of openings formed in the first shaping aperture member 203 and those formed in the second shaping aperture member 206.

FIG. 19A and FIG. 19B are diagrams showing an example of openings formed in shaping aperture members in the second embodiment.

FIG. 19A shows an example of openings formed in the first shaping aperture member 203. FIG. 19B shows an example of openings formed in the second shaping aperture member 206. As shown in FIG. 19A, the first shaping aperture member 203 has a plurality of openings 502, 504, 512, 514, 522, 524, 532, and 534 formed therein. Here, the openings 502 and 504 constitute a pair, the openings 512 and 514 a pair, the openings 522 and 524 a pair, and the openings 532 and 534 a pair. Of the openings 502 and 504, one opening 504 is formed in a square or rectangular shape. The other opening 502 is formed in a shape in which its edges extend by changing its direction at some midpoint. Here, the opening 502 is formed in a shape in which its edges extend by changing its direction at right angles at some midpoint, in a so-called L-letter shape. The opening 502 is formed in such a way that it has a first edge positioned opposite to one edge of the opening 504, which is separated by L and in parallel with each other, and a second edge positioned opposite to another edge of the opening 504, which is separated by L' and in parallel with each other. The first edge and the second edge are formed so that they are connected at right angles. That is, they are formed by providing an area between the openings that has an interval L and an interval L' in different directions and blocks the electron beam 200. The pair of the openings 512 and 514 is formed symmetrically to the pair of the openings 502 and 504 in a vertical direction. The pair of the openings 522 and 524 is formed symmetrically to the pair of the openings 502 and 504 in a horizontal direction. The pair of the openings 532 and 534 is formed symmetrically to the pair of the openings 502 and 504 in both horizontal and vertical directions. As shown in FIG. 19B, the second shaping aperture member 206 has a plurality of openings 506, 516, 526, 536, 508 formed therein. The opening 508 in the center is formed in a square or rectangular shape. The plurality of other openings 506, 516, 526, and 536 is arranged to surround the opening 508 in the center. The openings 506, 516, 526, and 536 are formed in a shape in which its edges extend by changing its direction at right angles at some midpoint, in a so-called L-letter shape. The opening 506 is formed in such a way that it has a first edge positioned opposite to one edge of the opening 508, which is separated by L" and in parallel with each other, and a second edge positioned opposite to another edge of the opening 508, which is separated by L'" and in parallel with each other. That is, they are formed by providing an area between the openings that has an interval L" and an interval L'" in different directions and blocks the electron beam 200. The first edge and the second edge are formed so that they are connected at right angles. The opening 516 is formed symmetrically to the opening 506 in the vertical direction. The opening 526 is formed symmetrically to the opening 506 in the horizontal direction. The opening 536 is formed symmetrically to the opening 506 in both vertical and horizontal directions.

FIG. 20 is a diagram showing an example of patterns formed by the shaping aperture members in FIG. 19A and FIG. 19B.

FIG. 20 shows a portion 540 through which the electron beam 200 passes when the electron beam 200 passes through both the opening 502 and the opening 516. Similarly, a portion 542 through which the electron beam 200 passes when the electron beam 200 passes through both the opening 504 and the opening 508 is shown. Then, in FIG. 20, the beam form and size are determined by relatively shifting the first shaping aperture member 203 and the second shaping aperture member 206 in the same direction as that of the interval L by the dimension x and in the same direction as that of the interval L' by the dimension x'. Then, as shown in FIG. 20, a pattern is formed into a shape of the portion 540. Similarly, a pattern is formed into a shape of the portion 542. Here, the dimension between the two patterns is $L_{01}$ in the same direction as that of the interval L and $L_{02}$ in the same direction as that of the interval L'. Then, an error of the pattern dimension $L_{01}$ is given by: shaping deflection error=$\sqrt{(<\delta x>^2)}$. Similarly, an error of the pattern dimension $L_{02}$ is given by: shaping deflection error=$\sqrt{(<\delta x'>^2)}$. Thus, dimensional accuracy is determined solely by a shaping deflection error and an influence of a position error caused by a conventional variable shaped beam on a dimension error can be excluded. That is, three error factors can be reduced to one. Therefore, if all error factors are at about the same level, the error level can be reduced to $1/(\sqrt{3})$. Accordingly, dimensional accuracy of a non-irradiation portion (a portion between two patterns) that is formed by two patterns and has a corner at which two straight lines intersect at right angles can be improved. Further, a non-irradiation portion having a high-precision corner can be formed without the need to form the non-irradiation portion in two operations and therefore, the number of shots in the non-irradiation portion can be reduced, resulting in improved throughput.

As described above, high-precision dimensions can be written also when a pattern in an L-letter shape formed in a portion where the electron beam 200 is blocked and in which the direction thereof changes at right angles at some midpoint of the dimension $L_{01}$ and the dimension $L_{02}$ is formed.

FIG. 21 is a diagram showing an example of patterns formed in other shaping aperture members in the second embodiment.

FIG. 21 shows a case in which the openings 506, 516, 526, and 536 in FIG. 19B whose opening size is enlarged in the outward direction are arranged. Here, an opening 517 as a substitute for the opening 516 in FIG. 19B is shown. Since the opening size is enlarged, the opening 502 could be contained in the opening 517, as shown in FIG. 21, depending on the relative position relation of the first shaping aperture member 203 and the second shaping aperture member 206. In such a case, a portion 541 through which the electron beam 200 passes when the electron beam 200 passes through both the opening 502 and the opening 517 has a shape similar to that of the opening 502. FIG. 21 also shows a portion 543 through which the electron beam 200 passes when the electron beam 200 passes through both the opening 504 and the opening 508. In such a case, the dimension between two patterns by a pattern in the shape of the portion 541 and that in the shape of the portion 543 will be $L_{01}$ in the same direction as that of the interval L and $L_{02}$ in the same direction as that of the interval L'. Then, an error of the pattern dimension $L_{01}$ is given by: shaping deflection error=$\sqrt{(<\delta x>^2)}$. Similarly, an error of the pattern dimension $L_{02}$ is given by: shaping deflection error=$\sqrt{(<\delta x'>^2)}$. Thus, high-precision dimensions can similarly be achieved even when an opening of one shaping aperture member is contained in an opening of the other shaping aperture member.

Here, an opening formed in a shape in which its edges extend by changing its direction at a corner at which straight lines intersect, that is, like an intersection has been described in the above examples, but the present embodiment is not limited to this. The opening may be formed in a shape in which its edges extend by changing its direction with a smooth curve. Similarly, a pair of square or rectangular openings may be formed with corners having a smooth curve.

FIG. 22A and FIG. 22B are diagrams showing another example of openings formed in the shaping aperture members in the second embodiment.

FIG. 22A shows an example of openings formed in the first shaping aperture member 203. FIG. 22B shows an example of openings formed in the second shaping aperture member 206. As shown in FIG. 22A, the first shaping aperture member 203 has a plurality of openings 602, 604, 612, 614, 622, 624, 632, and 634 formed therein. Here, the openings 602 and 604 constitute a pair, the openings 612 and 614 a pair, the openings 622 and 624 a pair, and the openings 632 and 634 a pair. Of the openings 602 and 604, one opening 604 is formed in a square or rectangular shape at least one corner of which is formed by a smooth curve. The other opening 602 is formed in a shape in which its edges extend by changing its direction at some midpoint with a smooth curve. Here, the opening 602 is formed in a shape in which its edges extend by changing its direction at right angles at some midpoint with a smooth curve, in a so-called L-letter shape whose bending portion is a curve. The opening 602 is formed in such a way that it has a first edge positioned opposite to one edge of the opening 604, which is separated by L and in parallel with each other, and a second edge positioned opposite to another edge of the opening 604, which is separated by L' and in parallel with each other. The first edge and the second edge are formed so that they are connected by a smooth curve. That is, they are formed by providing an area between the openings that has an interval L and an interval L' in different directions connected by a smooth curve and blocks the electron beam 200. The pair of the openings 612 and 614 is formed symmetrically to the pair of the openings 602 and 604 in the vertical direction. The pair of the openings 622 and 624 is formed symmetrically to the pair of the openings 602 and 604 in the horizontal direction. The pair of the openings 632 and 634 is formed symmetrically to the pair of the openings 602 and 604 in both horizontal and vertical directions. As shown in FIG. 22B, the second shaping aperture member 206 has a plurality of openings 606, 616, 626, 636, 608 formed therein. The opening 608 in the center is formed in a square or rectangular shape with corners formed by a smooth curve. The plurality of other openings 606, 616, 626, and 636 is arranged to surround the opening 608 in the center. The openings 606, 616, 626, and 636 are formed in a shape in which its edges extend by changing its direction at right angles at some midpoint with a smooth curve, in a so-called L-letter shape whose bending portion is a curve. The opening 606 is formed in such a way that it has a first edge positioned opposite to one edge of the opening 608, which is separated by L" and in parallel with each other, and a second edge positioned opposite to another edge of the opening 608, which is separated by L'" and in parallel with each other. That is, they are formed by providing an area between the openings that has an interval L" and an interval L'" in different directions with bending portions formed by a curve and blocks the electron beam 200. The first edge and the second edge are formed so that they are connected at right angles by a smooth curve. The opening 616 is formed symmetrically to the opening 606 in the vertical direction. The opening 626 is formed symmetrically to the opening 606 in the horizontal direction. The opening 636 is formed symmetrically to the opening 606 in both vertical and horizontal directions.

FIG. 23 is a diagram showing an example of patterns formed by the shaping aperture members in FIG. 22A and FIG. 22B.

FIG. 23 shows a portion 640 through which the electron beam 200 passes when the electron beam 200 passes through both the opening 602 and the opening 616. Similarly, a portion 642 through which the electron beam 200 passes when the electron beam 200 passes through both the opening 604 and the opening 608 is shown. Then, in FIG. 23, the beam form and size are determined by relatively shifting the first shaping aperture member 203 and the second shaping aperture member 206 in the same direction as that of the interval L by the dimension x and in the same direction as that of the interval L' by the dimension x'. Then, as shown in FIG. 23, a pattern is formed into a shape of the portion 640. Similarly, a pattern is formed into a shape of the portion 642. Here, the dimension between the two patterns is $L_{o1}$ in the same direction as that of the interval L and $L_{o2}$ in the same direction as that of the interval L'. Then, an error of the pattern dimension $L_{o1}$ is given by: shaping deflection error=$\sqrt{(<\delta x>^2)}$. Similarly, an error of the pattern dimension $L_{o2}$ is given by: shaping deflection error=$\sqrt{(<\delta x'>^2)}$. Thus, dimensional accuracy is determined solely by a shaping deflection error and an influence of a position error caused by a conventional variable shaped beam on a dimension error can be excluded. That is, three error factors can be reduced to one. Therefore, if all error factors are at about the same level, the error level can be reduced to $1/(\sqrt{3})$. Accordingly, dimensional accuracy of a non-irradiation portion (a portion between two patterns) that is formed by two patterns and has a corner with a smooth curve can be improved. Further, a non-irradiation portion having a high-precision corner can be formed without the need to form the non-irradiation portion in two operations and therefore, the number of shots in the non-irradiation portion can be reduced, resulting in improved throughput.

As described above, high-precision dimensions can be drawn also when a pattern in an L-letter shape formed in a portion where the electron beam 200 is blocked and in which the direction thereof changes at right angles at some midpoint of the dimension $L_{o1}$ and the dimension $L_{o2}$ with a smooth curve is formed.

The present embodiment has been described with reference to concrete examples. However, the invention is not limited to such concrete examples.

Though descriptions of components that are not directly necessary for describing the invention such as device components and control techniques are omitted, required device components or control techniques may appropriately be selected and used. For example, though components of the control part for controlling the writing apparatus 100 are omitted, it is needless to say that required components of the control part can appropriately be selected and used.

Further, the charged particle beam writing method has been described above by assuming the use of a positive type resist based on present circumstances in which the positive type resist is superior to a negative type resist in performance, and if conversely a negative type resist superior to a positive type resist in performance should be developed in the future, the present method can still be used. Examples in which dimensional accuracy of a resist left after development is improved have been described above by assuming the use of a positive type resist, but if a negative type resist is used, the invention can be used to improve dimensional accuracy of a "portion where a resist is removed after development". The reason for this will briefly be described below. In the aforementioned examples of a positive type resist, for example, hatched portions in FIG. 10B and FIG. 11B are irradiated with an electron beam and a resist is removed during development. When a negative type resist is used, it is necessary only to replace the above portion by the following: the hatched portions are irradiated with an electron beam, and a resist is left after development and a portion that is not irradiated is removed after development. FIG. 10B and FIG. 11B correspond to conventional examples and a conventional variable shaped beam is shone on each of both ends of a resist removed portion. Thus, a position error of the beam is added as a dimensional accuracy deterioration factor of the resist removed portion, but by forming both sides of the resist removed portion using a set of beam like in FIG. 10B and FIG. 11B by applying the method of the invention, a position error of the beam will not be added as an accuracy deterioration factor of the dimension thereof. Therefore, dimensional accuracy of a resist removed portion can be improved compared with a conventional method when a negative type resist is used.

In addition, all shapes of the first and second shaping apertures, charged particle beam writing apparatuses, and charged particle beam writing methods that are provided with elements of the invention and can appropriately be designed and modified by those skilled in the art are included in the scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus, comprising:
   an irradiation part configured to irradiate a charged particle beam;
   a first shaping aperture member having passing areas, that the charged particle beam passes through, on both sides of an area blocking the charged particle beam;
   a deflection part configured to deflect the charged particle beam that has passed through the first shaping aperture member;
   a second shaping aperture member having passing areas, that the charged particle beam passes through, on both sides of an area blocking the deflected charged particle beam; and
   a stage on which a target workpiece irradiated with the charged particle beam that has passed through the second shaping aperture member is placed,
   wherein two patterns are formed by the charged particle beam that has passed through the first and second shaping aperture members, said deflection part controls a dimension between said two patterns.

2. The charged particle beam writing apparatus according to claim 1, wherein a plurality of openings formed in the first shaping aperture member as passing areas.

3. The charged particle beam writing apparatus according to claim 2, wherein the plurality of openings are formed with parallel edges facing each other.

4. The charged particle beam writing apparatus according to claim 2, wherein each of the plurality of openings is formed in a quadrangular shape.

5. The charged particle beam writing apparatus according to claim 4, wherein the plurality of openings are formed with parallel edges facing each other.

6. The charged particle beam writing apparatus according to claim 2, wherein each of the plurality of openings is formed in a trapezoid shape.

7. The charged particle beam writing apparatus according to claim 6, wherein the plurality of openings are formed with parallel edges facing each other.

8. The charged particle beam writing apparatus according to claim 1, wherein portions of the passing areas are connected.

9. A charged particle beam writing method comprising:
writing first and second patterns placed side by side with predetermined spacing by using first and second shaping aperture members in which openings, that a charged particle beam passes through, are formed on both sides of an area blocking the charged particle beam;
writing a third pattern to be connected to the second pattern by using the first and second shaping aperture members, between both sides of the second pattern, on the side opposite to the first pattern; and
controlling a predetermined spacing between said first and second patterns by controlling an amount of deflection of a shaping deflector deflecting the charged particle beam that haspassed through the first shaping aperture member.

10. A charged particle beam writing method comprising:
writing a first pair of patterns placed side by side with first spacing by using first and second shaping aperture members in which openings, that a charged particle beam passes through, are formed on both sides of an area blocking the charged particle beam;
writing a second pair of patterns placed side by side with second spacing and connected to the first pair of patterns by using the first and second shaping aperture members; and
controlling said first spacing between said first pair of patterns by controlling an amount of deflection of a shaping deflector deflecting the charged particle beam that has passed through the first shaping aperture member.

11. The charged particle beam writing method according to claim 10, wherein the second pair of patterns is connected, among ends of the first pair of patterns, to ends in a direction perpendicular to the direction in which the first pair of patterns is placed side by side.

12. The charged particle beam writing apparatus according to claim 2, wherein at least one of the plurality of openings is an opening extending by changing a direction thereof at some midpoint.

13. The charged particle beam writing apparatus according to claim 1, wherein an opening is formed using a curve in at least one of the first shaping aperture member and the second shaping aperture member as the passing areas.

\* \* \* \* \*